United States Patent
Egawa

(10) Patent No.: US 8,368,575 B2
(45) Date of Patent: Feb. 5, 2013

(54) PIPELINE TYPE A/D CONVERTER

(75) Inventor: Kazuki Egawa, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 114 days.

(21) Appl. No.: 13/048,361

(22) Filed: Mar. 15, 2011

(65) Prior Publication Data

US 2011/0241918 A1  Oct. 6, 2011

(30) Foreign Application Priority Data

Mar. 31, 2010 (JP) ................................. 2010-082273
Mar. 4, 2011 (JP) ................................. 2011-048194

(51) Int. Cl.
*H03M 1/38* (2006.01)
(52) U.S. Cl. ......................... 341/161; 341/155; 341/156
(58) Field of Classification Search .................. 341/155, 341/156, 161, 172, 150
See application file for complete search history.

(56) References Cited

U.S. PATENT DOCUMENTS

| | | | |
|---|---|---|---|
| 6,366,230 B1 | 4/2002 | Zhang et al. | |
| 6,756,928 B2 * | 6/2004 | Kawahito et al. | 341/150 |
| 7,259,709 B2 * | 8/2007 | Ogita et al. | 341/172 |
| 7,612,700 B2 * | 11/2009 | Kawahito et al. | 341/161 |
| 2002/0041248 A1 * | 4/2002 | Galton | 341/156 |
| 2004/0160351 A1 * | 8/2004 | Rossi | 341/161 |

FOREIGN PATENT DOCUMENTS

JP  2010-166447  7/2010

OTHER PUBLICATIONS

Nagaraj et al., "A 250-mW, 8-b, 52-Msamples/s Parallel-Pipelined A/D Converter with Reduced . . . ", IEEE Journal of Solid-State Circuits, vol. 32, No. 3, pp. 312-320, Mar. 1997.

* cited by examiner

*Primary Examiner* — Jean B Jeanglaude
(74) *Attorney, Agent, or Firm* — Morgan, Lewis & Bockius LLP

(57) ABSTRACT

A pipeline type A/D converter is capable of expanding an input range and increasing the number of bits of digital output signals, without increasing thermal noises or an open loop gain needed for an operational amplifier. The number of sample-hold capacitors is divided from M into N and the reference voltage is multiplied by N to increase the number of capacitors available to add to and subtract from the reference voltage. The input range is expanded and the number of bits of the digital output signals is increased. Because the analog signal is sampled by all the capacitors, thermal noise does not deteriorate. The open loop gain needed for the operational amplifier does not increase, since the ratio of the capacitors each used as a feedback element for amplifying the analog signal to the remaining capacitors is unchanged before and after the division of the capacitors.

4 Claims, 18 Drawing Sheets

PIPELINE TYPE A/D CONVERTER

This application claims priority to Japanese Patent Application No. 2010-082273, filed Mar. 31, 2010, and Japanese Patent Application No. 2011-048194, filed Mar. 4, 2011, both of which are hereby incorporated by reference.

TECHNICAL FIELD

The present invention relates to an A/D converter, in particular, to a pipeline type A/D converter in which input range and bit rate of digital output are increased.

BACKGROUND ART

Electronic devices, such as various image sensors and image processing equipments etc., which are under the necessity of converting analog signals into digital signals are required to do high speed processing of a large amount of data. As an A/D converter permitting to handle such processing, there has been known heretofore a pipeline type A/D converter configured by connecting cascade connected plural A/D converters to allow multiple A/D converting processing for one clock.

A conventional pipeline type A/D converter includes, e.g., a pipeline type A/D converter disclosed in Non-Patent Document 1.

Firstly, a description will be made to a configuration of the conventional general pipeline type A/D converter referring to the FIG. 10. FIG. 10 is a block diagram showing the configuration of the conventional general pipeline type A/D converter.

The pipeline type A/D converter 100 shown in FIG. 10 includes a sample-hold circuit 101, cascade connected k A/D converters 102 to 102-$k$, a memory 103, an arithmetic circuit 104, and a controller 105.

The sample-hold circuit 101 is for sampling and holding an analog signal Ain and for feeding the held analog signal Ain to a first A/D converter 102-1.

The A/D converters 102-1 to 102-$k$ are cascade connected, perform an A/D conversion by the amount corresponding to resolution responsible for each A/D converter 102-1 to 102-$k$ based on an analog signal input Vin to respective stages, and feed digital output signals $d_j$ (j=1, 2, ..., k) of s-digit to a memory 103. Further, the A/D converters 102-1 to 102-$k$ feed an analog signal Vout obtained in the respective stages from an analog output signal Ain the digital to analog converted result of the digital output signals $d_j$ to the following stage.

The memory 103 receives and stores the digital output signals $d_j$ of S-digit, determined by the k A/D converters 102-1 to 102-$k$. Namely, as a candidate of the memory 103, it may employ a semiconductor memory etc. which includes at least k addresses and can store S-bit data stored per one address.

The arithmetic circuit 104 synthesizes the digital output signals d stored in the memory 103 to calculate S-bit digital output signal Dout. A calculation method implemented in the arithmetic circuit 104 is as follows. Firstly, the most significant digit of $d_k$ and the least significant bit of $d_{k-1}$ are added by the binary system. Secondly, based on this result, the most significant digit of $d_{k-1}$ and the least significant bit of $d_{k-2}$ are added in the same way by the binary system. After this, this operation is repeated and the least significant bit of $d_1$ and the most significant bit of $d_2$ are summed up lastly. Thus, the result obtained by adding the all $d_j$ is the digital output signal Dout.

The controller 105 is for generating switching element control signals φ1 and φ2 to electrically switch each switching element in the A/D converters 102-1 to 102-$k$ to either of an electrically connected state or a disconnected state, in order to carry out the sampling and holding operations of the analog signal Vin, in synchronization with a master clock signal φ generated therein.

The A/D converters 102-1 to 102-$k$ have the same circuit configuration configured by the same elements, so a description will be made to the circuit configuration of the A/D converter 102-1 by referring to FIG. 11.

FIG. 11 is a circuit diagram showing a circuit configuration of the A/D converter 102-1 when its resolution is 1.5 bit. The resolution of 1.5 bit implicates that a digital output signal output from the A/D converter 102-1 has three values.

The A/D converter 102-1 shown in FIG. 11 includes sample-hold switching elements 121-125, sample-hold capacitors 126 and 127, an operational amplifier 128, an A/D sub-converter 129, and a multiple value output circuit 130.

The sample-hold switching elements 121-125 are for switching an electrical connection state to either of the connected state or the disconnected state, in response to the switching element control signals φ1 and φ2 output from the controller 105 to carry out sampling and holding operations. The sample-hold switching elements 121, 122 are connected between an input terminal into which the analog signal Vin is input and input terminals of the sample-hold capacitors 126 and 127, respectively. The sample-hold switching element 123 is connected between output terminals of the sample-hold capacitors 126 and 127 and analog ground. The sample-hold switching element 124 is connected between an output terminal of the operational amplifier 128 and the input terminal of the sample-hold capacitor 126. The sample-hold switching element 125 is connected between an output terminal of the multiple-value output circuit 130 and the input terminal of the sample-hold capacitor 127. The above switching elements are each switched to the connected state when the switching element control signals φ1 and φ2 are in High level, and to the disconnected state when the switching element control signals φ1 and φ2 are in low level.

The sample-hold capacitors 126 and 127 are for charging and discharging an electrical charge corresponding to the sampled analog signal Vin, based on the reference voltage output from the multiple-value output circuit 130.

The non-inverting (+) input terminal of the operational amplifier 128 is connected to the analog ground, and the inverting (−) input terminal is connected with the sample-hold capacitors 126 and 127. The operational amplifier 128 is for amplifying a potential difference of signals input into the two input terminals.

The A/D sub-converter 129 is configured with two comparators (not shown) and is for converting the analog signal Vin into the digital output signals $d_j$.

The multiple-value output circuit 130 is configured with multiple-value output switching elements 131 to 133. The switching elements 131 to 133 are connected between a voltage source for outputting of −Vref(V), 0V, and +Vref(V) that are prescribed voltages and an output terminal of the multiple-value output circuit 130, and is for switching the electrical connection state to either the connected state or the disconnected state based on the output result of the A/D sub-converter 129. The multiple-value output circuit 130 outputs one of reference voltages from −Vref(V), 0V, and +Vref(V), when the electrical connection state of the switching elements 131 to 133 are switched based on the digital output signal $d_j$. Vref is a prescribed voltage determined with an input range of A/D conversion and 0 is a voltage of the analog ground.

Behavior of the A/D converter 102-2 includes a sampling operation phase and a holding operation phase. These sampling and holding operations are alternatively repeated.

At the sampling operation, the sample-hold switching elements 121 to 123 are switched to the connected state and the sample-hold switching elements 124 and 125 are switched to the disconnected state. The analog signal Vin input from the A/D converter 102-1 of the previous stage is sampled by the sample-hold capacitors 126 and 127. Moreover, after the analog signal Vin is subjected to an analog to digital conversion into one of −1, 0, and 1, the A/D sub-converter 129 outputs the analog signal Vin input from the A/D converter 102-1 of the previous stage. The multiple-value output circuit 130 outputs one of the reference voltages from −Vref(V), 0V, and +Vref (V) based on the output result of the A/D sub-converter 129.

At the holding operation, the sample-hold switching elements 121 to 123 are switched to the disconnected state and the sample-hold switching elements 124 and 125 are switched to the connected state. Then, a capacitor 126 is connected between the output terminal and the inverting terminal of the operational amplifier 128 to utilize it as a feedback element. Thereby, the voltage of the analog signal Vin is doubly amplified. Furthermore, the electrical connection state of one of the switching elements 131 to 133 is switched to the connected state depending on the output result of the A/D sub-converter 129, and one of −Vref(V), 0V, and +Vref (V) is output to the capacitor 127. Thereby, the analog signal Vout possible to be taken within the range of doubly amplified analog signal Vin falls within the input range of an A/D converter of the following stage. The analog signal Vout becomes the analog signal Vin of the A/D converter 102-2 connected to the following stage of the A/D converter 102-1.

Subsequently, a description will be made to a relationship between the input range of the analog signal Vin and the output range of the analog signal Vout of the A/D converter 102-1 referring to FIG. 12. FIG. 12 is a graph illustrating the relationship between the input range of the analog signal Vin and the output range of the analog signal Vout of the A/D converter 102-1.

The horizontal axis of the graph shown in FIG. 12 indicates voltage of the analog signal Vin input into the A/D converter 102-1 and the vertical axis indicates voltage of the analog signal Vout output from the A/D converter 102-1.

As shown by arrows in FIG. 12, the range of voltage the analog signal Vin can be taken is an input range of the A/D converter 102-1. Moreover, the range of voltage that the analog signal Vout can be taken within the input range of the analog signal Vin, is the output range of the A/D converter 102-1 i.e., the input range of the A/D converter 102-2.

As described above, the addition and subtraction of the reference voltage determined according to an output value of the A/D sub-converter 129 from the analog signal Vin doubly amplified by the A/D converter 102-1 limits the analog Vout of the A/D converter within the input range of the A/D converter of the following stage.

It is to be noted that, however, in the pipeline type A/D converter built in a number of electrical devices such as digital cameras etc., it needs to cancel an offset caused by signals from the outside or an internal offset potentially inherent in the pipeline type A/D converter itself. Thus, even the pipeline type A/D converter from which S-bit digital output signal Dout can be output, the converter needs to be capable of outputting a larger digital value by S+0.5 bits. Accordingly, in a certain A/D converter included in plural A/D converters of the pipeline type A/D converters, it is designed to have a larger input range than usual. Generally, it is often the case with the first A/D converter where the largest input range is available, the converter may take a larger input range is taken than usual. Hence, in the pipeline type A/D converter 100, a description will then be made to the case where the first A/D converter 102-1 is configured to take a larger input range than usual.

A description will next be made to the circuit of the A/D converter 102-1b where a larger input range than usual may be taken, by referring to FIG. 13. FIG. 13 is a circuit diagram showing a circuit configuration of the A/D converter 102-1b which is allowed to take the larger input range than usual.

The A/D converter shown in FIG. 13 is one in which the input range is expanded as an example by 1.5 times, and the number of output bits of the digital output signal Dout is increased by S+0.5 bits.

Differences between the A/D converter 102-1 shown in FIG. 11 and the A/D converter 102-1b shown in FIG. 13 are that the multiple-value output circuit 130 further includes three multiple-value output switching elements 131b to 133b, and the A/D converter 102-1b further includes sample-hold switching elements 122b and 125b and a sample-hold capacitor 127b.

The sample-hold switching element 125b is connected, as with the sample-hold switching element 125, between the sample-hold capacitor 127b corresponding to the sample-hold capacitor 127 and the multiple-value output circuit 130.

The sample-hold capacitor 127b corresponds to the sample-hold capacitor 127, and is designed such that both terminals thereof are connected to the analog ground via the sample-hold switching elements 122b and 123 and an electrical charge is discharged to the analog ground for resetting it. That is, the sample-hold capacitor 127b does not sample or hold an electrical charge corresponding to the analog signal Vin and instead adds and subtracts the reference voltage output from the multiple-value output circuit 130 with 0V set as a reference.

The multiple-value output switching elements 131b to 133b are for switching, as with the multiple-value output switching elements 131 to 133, the electrical connection state based on the output result of the A/D sub-converter 129. The A/D sub-converter 129 includes four comparators (not shown) and is designed to be able to output one value from five values of −2, −1, 0, 1, and 2 depending on the analog signal Vin. Consequently, the multiple-value output circuit 130 can output two reference voltages, each including one of −Vref(V), 0V, and +Vref (V) based on the output result of the A/D sub-converter 129.

Even in the A/D converter 102-1b, the sampling operation and the holding operation are alternatively repeated by switching the electrical connection state of the respective switching elements in response to the switching element control signals $\phi 1$ and $\phi 2$, as with the A/D converter 102-1 shown in FIG. 11.

At the sampling operation, the sample-hold switching elements 121 to 123, 122b are switched to the connected state and the sample-hold switching elements 124, 125, 125b are switched to the disconnected state. The sample-hold capacitors 126 and 127 sample the voltage corresponding to the analog signal Vin. Further, the sample-hold capacitor 127b is reset to 0V.

At the holding operation, one of the multiple-value output switching elements 131 to 133 is connected to one of the multiple-value output switching elements 131b to 133b depending on the output result of the A/D sub-converter 129.

Then, one of the reference voltages from −Vref(V), 0V, and +Vref(V) is respectively output to the sample-hold capacitors 127 and 127b. Thereby, two reference voltages are added to and subtracted from the doubly amplified analog signal Vin. Even when the expanded input range of the analog signal Vin is input into the A/D converter 102-1, the analog signal Vout output from the A/D converter 102-1 falls within the input range of the A/D converter 102-2 of the following stage.

Subsequently, a description will be made to a relationship between the input range of the analog signal Vin and the output range of the analog signal V out of the A/D converter 102-1b, by referring to FIG. 14. FIG. 14 is a graph illustrating a relationship between the input range of the analog signal Vin and the output range of the analog signal Vout of the A/D converter 102-1b.

The horizontal axis of the graph shown in FIG. 14 indicates voltage of the analog signal Vin input into the A/D converter 102-1b, and the vertical axis thereof indicates voltage of the analog signal Vout output from the A/D converter 102-1b.

As shown by arrows in FIG. 14, the input range of the A/D converter 102-1b is expanded by 1.5 times from an input-output characteristic as shown in FIG. 12. Specifically, the output range of the A/D converter 102-1b falls within the input range of the A/D converter 102-2. This means that the input range of the pipeline type A/D converter is expanded by the amount corresponding to bits processed by the A/D converter 102-1b. The first A/D converter 102-1b processes the most significant bit out of the S-bit digital output signal Dout. For this reason, when the input range of the first A/D converter 102-1b is expanded by 1.5 times, the whole input range of the pipeline type A/D converter 100 is expanded by 1.5 times, which enables increasing the digital output signal Dout to S+0.5 bits.

In FIG. 11, while the description has been made as to the A/D converter 102-1 of which resolution is 1.5 bits, the resolution is not necessarily limited to 1.5 bits.

FIG. 15 is a circuit diagram showing a circuit configuration of the A/D converter 102-1c of which resolution is 2.5 bits. The resolution of 2.5 bits implicates that a digital output signal output from the A/D converter 102-1c has seven values.

FIG. 15 is a circuit diagram configured with the same elements as those of the A/D converter 102-1 shown in FIG. 11. There are differences therebetween in that the resolution gets 2.5 times, so the amplification degree of the analog signal Vin gets four times. Specifically, the A/D converter 102-1c includes sample-hold switching elements 221 to 229, sample-hold capacitors 230 to 233, an A/D sub-converter 235, and the multiple-value output circuit 236 including 12 switching elements 237 to 245. The multiple-value output circuit 236 is designed to be able to output three reference voltages each including one of −Vref (V), 0V, and +Vref (V) based on the digital value determined according to the analog signal Vin output from the A/D sub-converter 235.

The sample-hold switching elements 221 to 229 are for switching an electrical connection state to either the connected state or the disconnected state to carry out the sampling and holding operations, in response to the switching element control signals φ1 and φ2. The sample-hold switching elements 221 to 224 are connected between input terminals for inputting the analog single Vin and input terminals of the sample-hold capacitors 230 to 233, respectively. The sample-hold switching element 225 is connected between output terminals of the sample-hold capacitors 230 to 233 and the analog ground. The sample-hold switching element 226 is connected between the output terminal of the operational amplifier 234 and the input terminal of the sample-hold capacitor 230. The sample-hold switching elements 227 to 229 are connected between output terminals of the multiple-value output circuit 236 and the input terminals of the sample-hold capacitors 231 to 233, respectively. The above respective switching elements are switched to the connected state when the switching element control signals φ1 and φ2 are in High level, and to the disconnected state when the switching element control signals φ1 and φ2 are in Low level.

At the sampling operation, the sample-hold switching elements 221 to 225 are firstly switched to the connected state and the sample-hold switching elements 226 to 229 are switched to the disconnected state. The analog signal Vin is sampled by the sample-hold capacitors 230 to 233. The A/D sub-converter 235 includes six A/D converters (not shown) which perform an A/D conversion of the analog signal Vin into one of seven values −3, −2, −1, 0, 1, 2, and 3 for thereafter outputting it. The multiple-value output circuit 236 outputs three reference voltages each including one of −Vref(V), 0V, and +Vref (V) based on the output result of the A/D sub-converter 235.

At the holding operation, the sample-hold switching elements 221 to 225 are switched to the disconnected state and the sample-hold switching elements 226 to 229 are switched to the connected state. A capacitor 230 is connected between an output terminal and an inverting input terminal of the operational amplifier 234 to use it as a feedback element. This amplifies the voltage of the analog signal Vin to four times thereof. Moreover, depending on the output result of the A/D sub-converter 235, one electrical connection state of each of the switching elements 237 to 239, 240 to 242, and 243 to 245 is switched to the connected state and one of −Vref(V), 0V, and +Vref(V) is output into each of the capacitors 231 to 233. Thereby, the analog signal Vout that can be taken within the range of the fourfold amplified analog signal Vin is made to fall within the input range of the A/D converter of the following stage. Then, the analog signal Vout becomes the analog signal Vin of the A/D converter connected in the following stage.

Then, a description will be made to a relationship between an input range of the analog signal Vin of the A/D converter 102-1c and an output range of the analog signal Vout, by referring to FIG. 16. FIG. 16 is a graph illustrating the relationship between the input range of the analog signal Vin and the output range of the analog signal Vout of the A/D converter 102-1c.

The horizontal axis of the graph shown in FIG. 16 indicates voltage of the analog signal Vin input into the A/D converter 102-1c and the vertical axis thereof indicates voltage of the analog signal Vout output from the A/D converter 102-1c.

As shown by arrows in FIG. 16, the range of voltage that the analog signal Vin can be taken becomes the input range of the A/D converter 102-1c. Within the input range of the analog signal Vin, the range of voltage that the analog signal Vout can be taken becomes the output range of the A/D converter 102-1c i.e., an input range of the A/D converter of the next stage.

As described above, adding and subtracting the reference voltage to be determined according to an output value of the A/D sub-converter 235, to and from the fourfold amplified analog signal Vin by the A/D converter 102-1c prevents the analog signal Vout of the A/D converter from exceeding the input range of the A/D converter of the following stage.

A description will then be made to a circuit of the A/D converter 102-1d in which a wider input range may be taken than usual, by referring to FIG. 17. FIG. 17 is a circuit diagram showing a circuit configuration of the A/D converter 102-1d in which a wider input range may be taken than usual.

The A/D converter 102-1d shown in FIG. 17 has an input range expanded as an example by 1.25 times, and the number of output bits of the digital output signal Dout is increased to S+0.25 bits.

There are differences between the A/D converter 102-1c shown in FIG. 15 and the A/D converter 102-1d shown in FIG. 17 in that the multiple-value output circuit 236 further includes three multiple-value output switching elements 243b to 245b, and the A/D converter 102-1d further includes sample-hold switching elements 224b and 229b and the sample-hold capacitor 233b.

The sample-hold switching element 229b is connected between the sample-hold capacitor 233b corresponding to the sample-hold capacitor 233 and the multiple-value output circuit 236, as with the sample-hold switching element 229.

The sample-hold capacitor 233b is corresponds to the sample-hold capacitor 233 and both terminals thereof are connected to the analog ground via the sample-hold switching elements 224b and 225 to discharge an electrical charge to the analog ground for resetting it. That is, the sample-hold capacitor 233b does not sample or hold the electrical charge corresponding to the analog signal Vin, but adds and subtracts the reference voltage output from the multiple-value output circuit 236 with 0V set as reference.

The multiple-value output switching elements 243b to 245b are for switching an electrical connection state based on the output result of the A/D sub-converter 235, as with the multiple-value output switching elements 243 to 245. The A/D sub-converter 235 includes eight comparators (not shown) to perform an analog-digital conversion for one of nine values −4, −3, −2, −1, 0, 1, 2, 3, and 4 according to the analog signal Vin for outputting it. Thus, the multiple-value output circuit 236 is capable of outputting four reference voltages each including one of −Vref(v), 0V, and +Vref(V).

Even in the A/D converter 102-1d, the sampling operation and the holding operation are alternatively repeated by switching the electrical connection state of each switching element in response to the switching element control signals φ1 and φ2, as with the A/D converter 102-1c shown in FIG. 15.

At the sampling operation, the sample-hold switching elements 221 to 225, and 224b are switched to the connected state and the sample-hold switching elements 226 to 229, and 229b are switched to the disconnected state. An electrical charge corresponding to the analog signal Vin is sampled by the sample-hold capacitors 230 to 233. Additionally, the sample-hold capacitor 233b is reset to 0V.

At the holding operation, one of the multiple-value output switching elements 237 to 239, one of the multiple-value output switching elements 240 to 242, one of the multiple-value output switching elements 243 to 245, and one of multiple-value output switching elements 243b to 245b are switched to the connected state. Then, one reference voltage of −Vref(V), 0V, and +Vref (V) is output respectively to the sample-hold capacitors 231 to 233, and 233b. Thereby, even when four reference voltages are added to and subtracted from the fourfold amplified analog signal Vin so the input range of the analog signal Vin of the A/D converter 102-1d is made larger, the analog signal Vout output from the A/D converter 102-1d is made to fall within the input range of the A/D converter of the following stage.

Subsequently, a description will be made to a relationship between the input range of the analog signal Vin of the A/D converter 102-1d and the output range of the analog signal Vout, by referring to FIG. 18. FIG. 18 is a graph illustrating the relationship between the input range of the analog signal Vin of the A/D converter 102-1d and the output range of the analog signal Vout.

The horizontal axis of the graph shown in FIG. 18 indicates voltage of the analog signal Vin input into the A/D converter 102-1d and the vertical axis thereof indicates voltage of the analog signal Vout output from the A/D converter 102-1d.

As shown by arrows in FIG. 18, the input range of the A/D converter 102-1d is expanded by 1.25 times from an input-output characteristic shown in FIG. 16. In this regard, the output range of the A/D converter 102-1d falls within the input range of the A/D converter of the following stage. This means that the input range of the pipeline type A/D converter is expanded by the amount corresponding to bits processed by the A/D converter 102-1d. The first A/D converter 102-1d is responsible for the most significant bit out of the S-bit digital output signals Dout. On this account, when the input range of the first A/D converter 102-1d is expanded by 1.25 times, the input range of the whole pipeline type A/D converter 100 expands by 1.25 times, thus increasing the digital output signal Dout to S+0.25 bits.

PRIOR ART DOCUMENT

Non-Patent Document

Non-Patent Document 1: IEEE Journal of Solid State Circuits. Vol. 32. No3. March 1997. P312-P320

SUMMARY OF THE INVENTION

Problem to be Solved

In the pipeline type A/D converter 100 of Non-Patent Document 1, however, the newly added sample-hold capacitors 127b and 233b are not involved in sampling of the analog signal Vin from the A/D converter of the previous stage. In general, where k denotes Boltzmann's constant, T denotes the absolute temperature, Ca denotes a total capacitance connected to the operational amplifier of the A/D converter, and Cb denotes a capacitance of a sample-hold capacitor for sampling the analog signal Vin, thermal noises Vn of input conversion in the A/D converter is expressed by $Vn=(k \times T \times Ca)^{0.5}/Cb$.

In other words, the increase in number of the capacitors which are not involved in sampling of the analog signal Vin entails a problem of increasing the thermal noises of the pipeline type A/D converter 100.

Further, the increase in number of the capacitors causes an increase in a ratio of the remaining capacitors to capacitances of the capacitors each used as a feedback element of the operational amplifiers 128 and 234 at the holding operation. This brings about a decrease in the feedback amount of the operational amplifiers 128 and 234. Generally speaking, the pipeline type A/D converter needs a high feedback amount to satisfy the demand of linearity. For example, when the feedback amount is reduced to ⅔ thereof, an open loop gain of the operational amplifier 128 has to be set to 3/2 thereof. In order to increase the open loop gain of the operational amplifier, it usually brings with an increase in power consumption and an increase in area of the pipeline type A/D converter. Refinement process poses a problem that it is difficult to achieve the high open loop gain itself with a reduced power supply voltage.

The present invention has been made in view of the aforementioned problems and an objective thereof is to provide a pipeline type A/D converter able to increase the number of bits of an input range and digital output signals, without increasing the thermal noises and open loop gain required for and the operational amplifier.

Solution to the Problem

To solve the aforesaid problems, in order to achieve the above object, a pipeline type A/D converter is configured to be described below.

According to an aspect of the present invention, there is provided a pipeline type A/D converter, including: a sample-hold section for sampling and holding an analog signal; a plurality of A/D converting sections for converting the analog signal held by the sample-hold section into a plurality of digital signals; an arithmetic section for synthesizing the plural digital signals output from the plurality of A/D converting sections; and a control section for controlling operations executed by the plurality of A/D converting sections, wherein each of the plurality of A/D converting sections includes an A/D sub-converting section for converting an analog signal into a digital signal, a reference voltage generating section for generating a reference voltage corresponding to a converted result by said each of the plurality of A/D sub-converting sections, and a signal amplifying section for amplifying a differential signal between the reference voltage and the analog signal, wherein the signal amplifying section includes: N×M charge and discharge elements each having a capacitance C/N, where C denotes a prescribed capacitance of a positive integer, N denotes a prescribed division number of an integer equal to or greater than 1, and M denotes an amplification degree of the analog signal of an integer equal to or greater than 2; a switching element; and an operational amplifier, wherein the reference voltage generating section outputs the reference voltage obtained by multiplying a prescribed voltage by N, wherein at a sampling operation, the control section controls for sampling the analog signal by use of all of the N×M charge and discharge elements, and wherein at a holding operation, the control section controls for amplifying the analog signal to M times thereof by use of N charge and discharge elements out of all of the N×M charge and discharge elements, and for adding and subtracting the reference voltage obtained by multiplying the prescribed voltage by N to and from the analog signal amplified by use of remaining N×(M−1) charge and discharge elements.

According to the pipeline type A/D converter, the control section controls the operation using all the N×M charge and discharge elements included in the A/D converting section as charge and discharge elements to sample and hold the analog signal. Accordingly, this avoids an increase in the thermal noises induced by increasing the charge and discharge elements not involved in sampling of the analog signal. The control sections controls the operation such that M charge and discharge elements thereof are each used as a feedback element to amplify the analog signal, and the remaining N×(M−1) charge and discharge elements are used for addition and subtraction of the reference voltage. This does not increase the ratio of the capacitance of the remaining capacitors to that of the capacitors used as the feedback element, and does not decrease a loop gain of the operational amplifier, which prevents an increase in an thermal noise or an open loop gain needed for the operational amplifier. Thus, this enables expanding the input range of the pipeline type A/D converter and increasing the number of bits of the digital output signals.

In the above pipeline type A/D converter, wherein each of the charge and discharge elements is connected between an input terminal of the analog signal and an inverting input terminal of the operational amplifier, wherein the switching element may include a first switching element connected between the input terminal of the analog signal and an input terminal of a charge and discharge element, a second switching element connected between the output terminal of the operational amplifier and the input terminal of the charge and discharge element, and a third switching element connected between the output terminal of the reference voltage generating section and the input terminal of the charge and discharge generating section, wherein the control section may control a switching operation of an electrical connection state the first to third switching elements such that, at the sampling operation, all of the N×M charge and discharge elements each are connected between the input terminal and the inverting input terminal of the operational amplifier through the first switching element, and, at the holding operation, the N charge and discharge elements out of all of the N×M charge and discharge elements each are connected between the output terminal and the inverting input terminal of the operational amplifier through the second switching element, the remaining N×(M−1) charge and discharge elements each are connected between the output terminal of the reference voltage generating section and the inverting input terminal of the operational amplifier through the third switching element.

According to the pipeline type A/D converter, the control section controls the first switching element into an electrically connected state to connect all the charge and discharge elements between the input terminals of the analog signal and the inverting input terminals of the operational amplifiers, respectively. This allows performing a sampling operation of the analog signal by using all of the charge and discharge elements. Further, the control section puts the second switching element and the third switching element into an electrically connected state, connects M charge and discharge elements of all the N×M charge and discharge elements between the output terminals and the inverting input terminals of the operational amplifiers, respectively, and connects the remaining N×(M−1) charge and discharge elements between the output terminals of the reference voltage generating sections and the inverting input terminals of the operational amplifiers, respectively. This adds and subtracts the reference voltage of the reference voltage obtained by multiplying a prescribed voltage by N times to and from the amplified analog signal by M times, thus enabling a holding operation of the analog signal so that the analog signal falls within the input range of the A/D converting section of the following stage.

In the above pipeline type A/D converter, the reference voltage generating section may generate the reference voltage obtained by multiplying the prescribed voltage by N, where the prescribed voltage is any one of −Vref(V), 0V, and +Vref (V).

According to the pipeline type A/D converter, when a prescribed voltage determined in accordance with the input range of the A/D converter is Vref, one of −Vref(V), 0V, and +Vref(V) is taken as the reference voltage and outputs it after the prescribed voltage is multiplied by M times. Thereby, the addition and subtraction of the N-fold reference voltage to and from the amplified analog signal by multiplying M times allows falling of the analog signal within the input range of the A/D converting section of the following stage, when the analog signal is input into the A/D converting section of the following stage.

In the above pipeline type A/D converter, when N is 1, the reference voltage generating section may output either the reference voltage having an identical voltage to the prescribed voltage or the reference voltage obtained by multiplying the prescribed voltage by L, where L is a positive integer equal to or greater than 1, and wherein the control section may control an operation, at the sampling operation, for sampling the analog signal by use of all of the M charge and discharge elements, and at the holding operation, for amplifying the analog signal by M by use of one of all the M charge and discharge elements, and for adding and subtracting either the reference voltage having an identical voltage to the prescribed voltage or the reference voltage obtained by multiplying the prescribed voltage by L, where L is a positive integer equal to or greater than 1, to and from the analog signal amplified by use of remaining M−1 charge and discharge elements.

According to the above pipeline type A/D converter, when N is 1, the reference voltage generating section outputs either the reference voltage having an identical voltage to the prescribed voltage or the reference voltage obtained by multiplying the prescribed voltage by L, where L is a positive integer equal to or greater than 1. In such a case, the control section controls an operation, at the sampling operation, for sampling the analog signal by use of all of the M charge and discharge elements, and at the holding operation, for amplifying the analog signal by M by use of one of all the M charge and discharge elements, and for adding and subtracting either the reference voltage having an identical voltage to the prescribed voltage or the reference voltage obtained by multiplying the prescribed voltage by M to and from the analog signal amplified by use of remaining M−1 charge and discharge elements. Accordingly, as with the pipeline type A/D converter as described above, this enables expanding the input range of the pipeline type A/D converter and increasing the number of bits of the digital output signals without increasing the thermal noise or an open loop gain needed for the operational amplifier.

Advantageous Effect of the Invention

According to the present invention, all the N×M charge and discharge elements are used as the charge and discharge elements to sample the analog signal. Herein, M denotes an amplification degree of the analog signal and N denotes the number of division of the charge and discharge elements compared with the prior art. When N=1, it designates the number of the charge and discharge elements in the case where the range is not expanded in the prior art. Since all the charge and discharge elements operate for sampling of the analog signal, an increase in the thermal noises does not occur as compared with the case where the range is not expanded in the prior art. Furthermore, N charge and discharge elements each are used as a feedback element to amplify the analog signal, whereas the remaining N×(M−1) charge and discharge elements are used for addition and subtraction of the reference voltage. On that account, since the ratio of the capacitance of the remaining charge and discharge elements to that of the charge and discharge elements each used as the feedback element is unchanged, the amount of feedback does not decrease, the open loop gain needed for the operational amplifier will not be increased as compared with the case where the range is not expanded in the prior art.

Nevertheless, increasing the number of division N permits increasing the number of the freely controllable charge and discharge elements, which expands the input range of the pipeline type A/D converter, without increasing thermal noises and the open loop gain needed for the operational amplifier.

BRIEF DESCRIPTION OF THE DRAWINGS

FIG. 11 is a circuit diagram showing a circuit configuration of the A/D converter 102-1;

DESCRIPTION OF EMBODIMENTS

Figure 1:
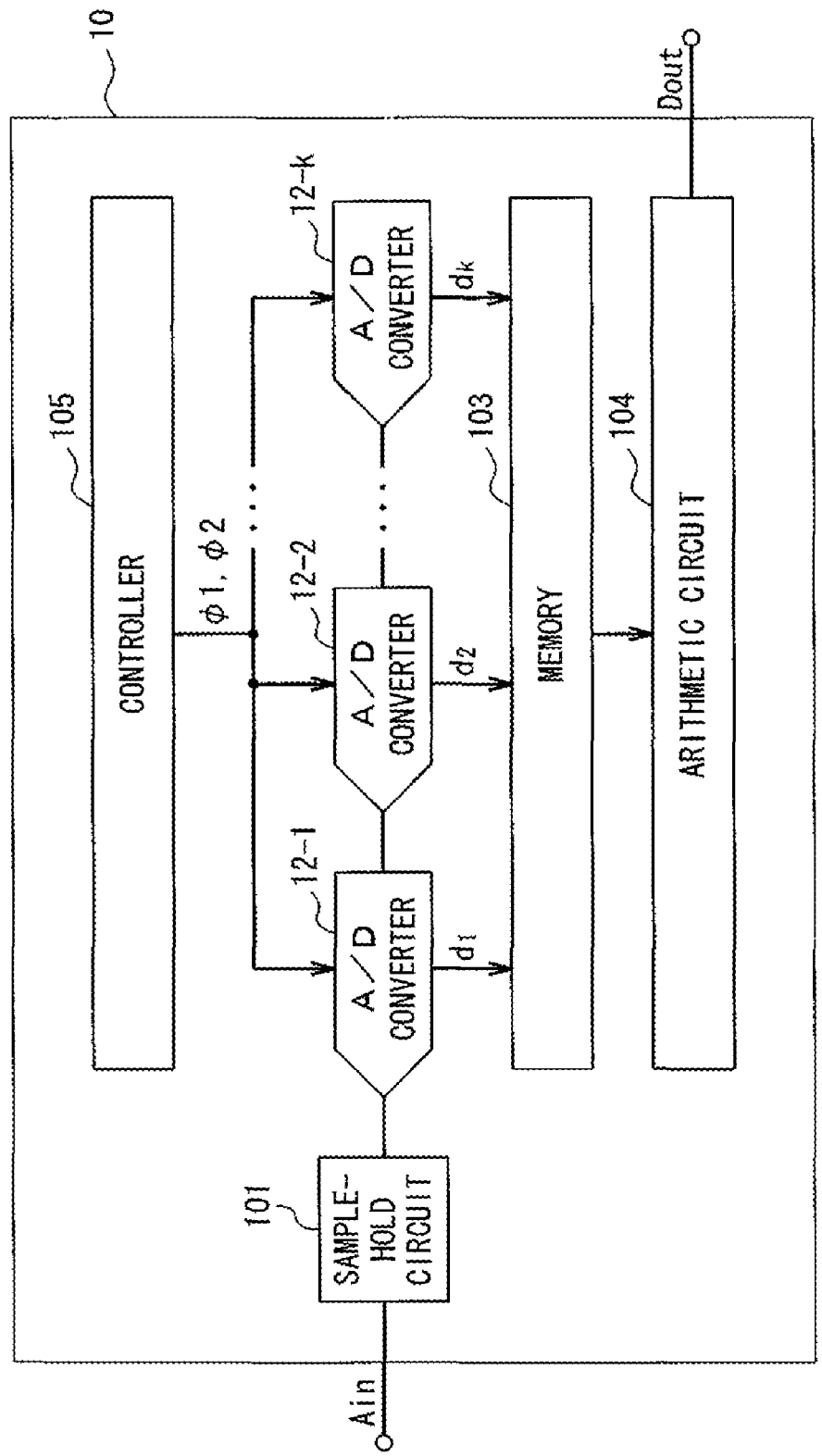
FIG. 1 is a block diagram showing a pipeline type A/D converter 10 according to the present embodiment.

Hereinafter, a description will be made to embodiments of the present invention with reference to the accompanying drawings. Herein, the same reference numeral denotes the same constituent components throughout the following description.

(Configuration of Pipeline Type A/D Converter 10)

A configuration of the pipeline type A/D converter 10 according to the instant embodiment will now firstly described, by referring to FIG. 1. FIG. 1 is a block diagram showing the configuration of the pipeline type A/D converter 10 according to the present embodiment.

Figure 10:
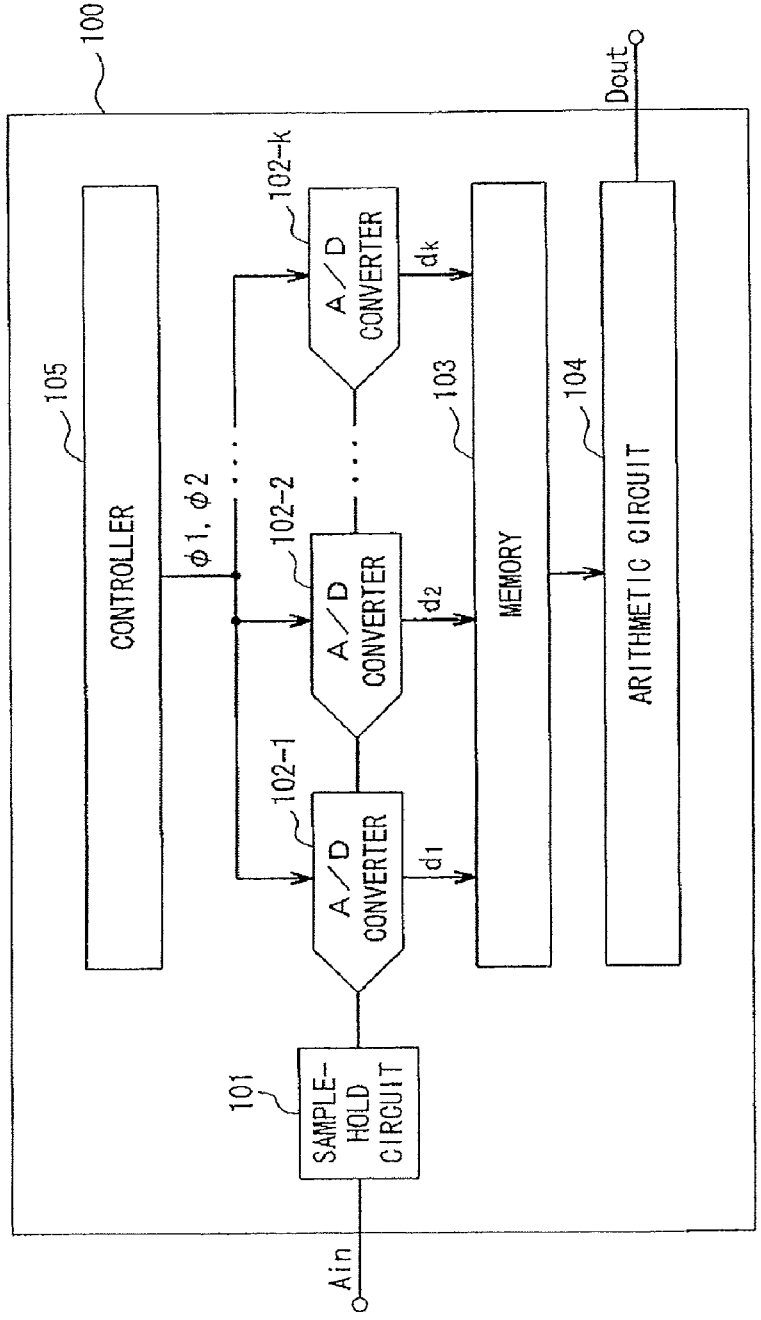
FIG. 10 is a block diagram showing a configuration of the conventional typical pipeline type A/D converter 100.

The pipeline type A/D converter 10 shown in FIG. 1 has the same circuit configuration as that of a pipeline type A/D converter 100 shown in FIG. 10. However, its internal circuit configuration of the A/D converters 12-1 to 12-k is different from those of the A/D converters 102-1 to 102-k.

Of the A/D converters 12-1 to 12-k, only the first A/D converter 12-1 is a circuit including elements necessary to increase an input range. Additionally, the A/D converters 12-2 to 12-k all have the same circuit configuration.

For facilitate understanding of the description of the present embodiment, the description will be made assuming that the pipeline type A/D converter 10 performs a S-bit analog to digital conversion, resolution responsible for the A/D converters 12-1 to 12-k are respectively 1.5 bits (in this case, the input signal is doubly amplified). The number of division of the capacitors is 2 (i.e., N=2), and the input range is expanded by 1.5 times utilizing four capacitors obtained by N×M=2×2=4. In other words, the pipeline type A/D converter 10 converts an analog signal Ain into a digital output signal Dout of S+0.5 bits.

(Configuration of A/D Converter 12-1)

Figure 2:
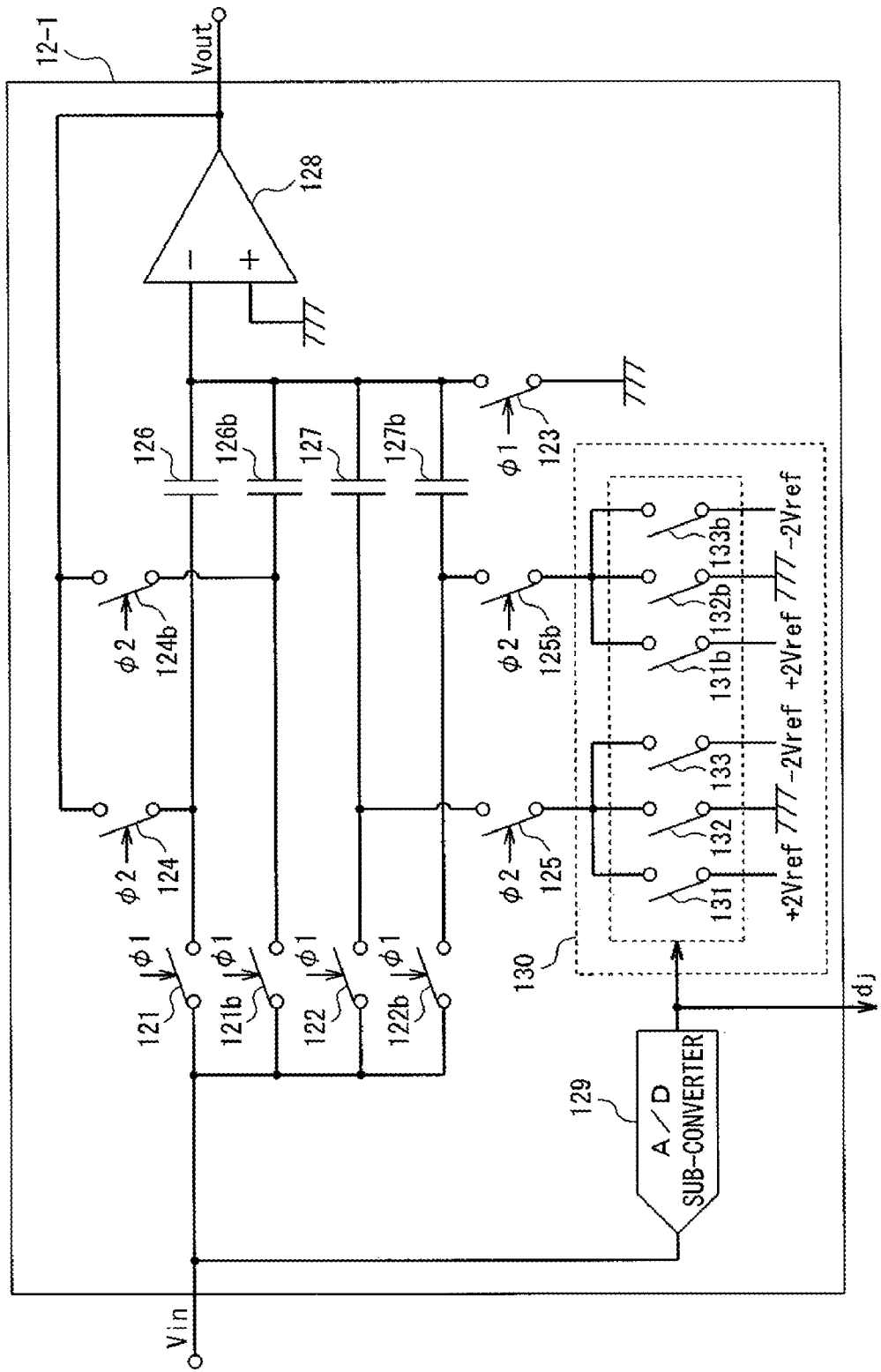
FIG. 2 is a block diagram showing a configuration of a pipeline type A/D converter 12-1 when resolution is 1.5 bits and the number of division of capacitors is 2.

Subsequently, referring now to FIG. 2, a description will next be made to a configuration of the A/D converter 12-1 of the pipeline type A/D converter 10. FIG. 2 is a block diagram showing the configuration of the A/D converter 12-1.

Figure 11:
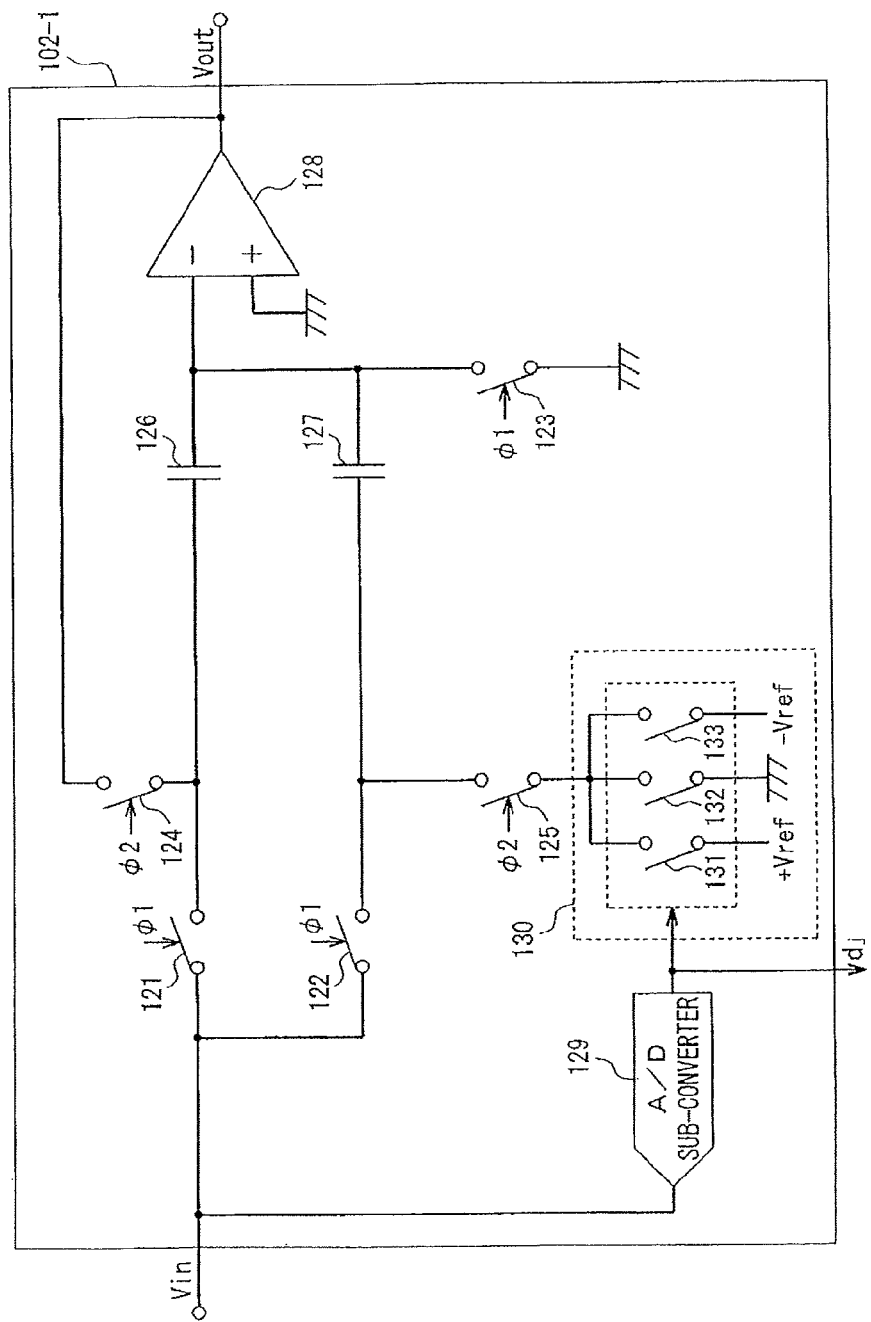
FIG. 11 is a drawing explaining a circuit configuration of the A/D converter 102-1 of which resolution is 1.5 bits.

The A/D converter 12-1 shown in FIG. 2 has the same circuit configuration as that of the A/D converter 102-1 shown in FIG. 11, and further includes sample-hold switching elements 121b, 124b and a sample-hold capacitor 126b. A multiple-value output circuit 130 is designed to be capable of outputting two reference voltages each including one of −N×Vref (V)=−2×Vref(V), 0V, and +N×Vref (V)=+2×Vref (V) based on a digital value determined depending on the analog signal Vin output from an A/D sub-converter 129.

The sample-hold switching element 121b is connected between an input terminal of the analog signal Vin and an input terminal of the sample-hold capacitor 126b. The sample-hold switching element 121b is for switching an electrical connection state to either a connected state or a disconnected state to carry out sampling and holding operations for the analog signal Vin, as with the sample-hold switching element 121.

Further, the sample-hold switching element 124b is connected between an output terminal of the operational amplifier 128 and an input terminal of the sample-hold capacitor 126b. The sample-hold capacitor 124b is for switching an electrical connection state either to a connected state or a disconnected state, to carry out the sampling and holding operations of the analog signal Vin, as with the sample-hold switching element 124.

The number of sample-hold capacitors used for sampling the analog signal Vin of the A/D converter 12-1 is twice that of the A/D converter 102-1 shown in FIG. 11. However, a capacity value of the sample-hold capacitor of the A/D converter 12-1 is a half that of the A/D converter 102-1 shown in FIG. 11. Because of this, the total capacitance of four sample-hold capacitors 126, 126b, 127 and 127b of the A/D converter 12-1 remain unchanged from that of the two sample-hold capacitors 126 and 127 of the A/D converter 102-1 shown in FIG. 11.

The A/D converter 12-1 performs the same operations as the A/D converter 102-1 shown in FIG. 11 and is for alternatively repeating the sampling operation and the holding operation.

At the sampling operation, the sample-hold switching elements 121, 121b, 122, 122b, and 123 are switched to the connected state and the sample-hold switching elements 124, 124b, 125, and 125b are switched to the disconnected state. After that, an electrical charge corresponding to the analog signal Vin is sampled using all the four sample-hold capacitors 126, 126b, 127, and 127b and the A/D sub-converter 129 converts the analog output Vin into one of −2, −1, 0, 1, and 2 for outputting it.

All the four internal capacitors of the A/D converter 12-1 are used as sample-hold capacitors. Thus, all the capacitors are involved in sampling of the analog output Vin. Hence, there is no thermal noise originated from an increase in the number of the capacitors not involved in sampling of the analog signal Vin.

At the holding operation, the sample-hold switching elements 121, 121b, 122, 124b, and 123 are switched to the disconnected state and the sample-hold switching elements 124, 124b, 125, and 125b are switched to the connected state. Two sample-hold switching capacitors 126 and 126b are connected between an output terminal and an inverting input terminal of the operational amplifier 128 for use as a feedback element, thereby doubly amplifying the voltage of the analog signal Vin. Furthermore, depending on the output result of the A/D sub-converter 129, the doubly amplified reference voltage of one of −2×vref(V), 0V, and +2×vref(V) is output from the multiple-value output circuit 130 to the remaining two sample-hold capacitors 127 and 127b.

Of the four internal sample-hold capacitors 126, 126b, 127, and 127b in the A/D converter 12-1, the two sample-hold capacitors 126 and 126b connected between an output terminal and an inverting input terminal of the operational amplifier 128 are each used as a feedback element. For this reason, the ratio of capacitance of the remaining capacitors to that of the capacitors each used as the feedback element of the operational amplifier 128 does not increase, unlike the conventional pipeline type A/D converter 100. Thus, it is unnecessary to make greater for an open loop gain needed for the operational amplifier 128, since the feedback amount does not decrease.

The doubly amplified reference voltage is output from the multiple-value-output circuit 130 in the A/D converter 12-1 to the remaining two sample-hold capacitors 127 and 127b that are not used as the feedback element. Accordingly, the doubly amplified reference voltage is added to and subtracted from the doubly amplified analog input Vin. Because of this, even when the input range of the A/D converter 12-1 is expanded by 1.5 times, the analog output Vout is output so as to fall within the input range of the A/D converter 12-2 of the following stage.

In this way, at the sampling operation, since the sampling operation of the analog signal Vin is carried out utilizing all the capacitors, the thermal noises does not become bigger, even through the input range of the A/D converter 12-1 is expanded. Further, at the holding operation, since two capacitors out of the four capacitors are used as the feedback elements connected between the output terminal and the inverting input terminal of the operational amplifier 128, the feedback amount is unchanged even through the input range of the A/D converter 12-1 is expanded. Consequently, there is no need to increase the open loop gain needed for the operational amplifier 128. With the aforementioned A/D converter 12-1, it is possible to expand the input range and output the digital output signal Dout of S+α bits (α is equal to or more than 0) even by the pipeline type A/D converter 10 that originally outputs the S-bit digital output signal Dout.

Although the A/D converters 12-2 to 12-k may have the same circuit configurations as that shown in FIG. 11, it has the circuit configuration in which the voltage source of ±2×Vref used in the A/D converter 12-1 may also be used in the A/D converters 12-1 to 12-k.

Figure 14:
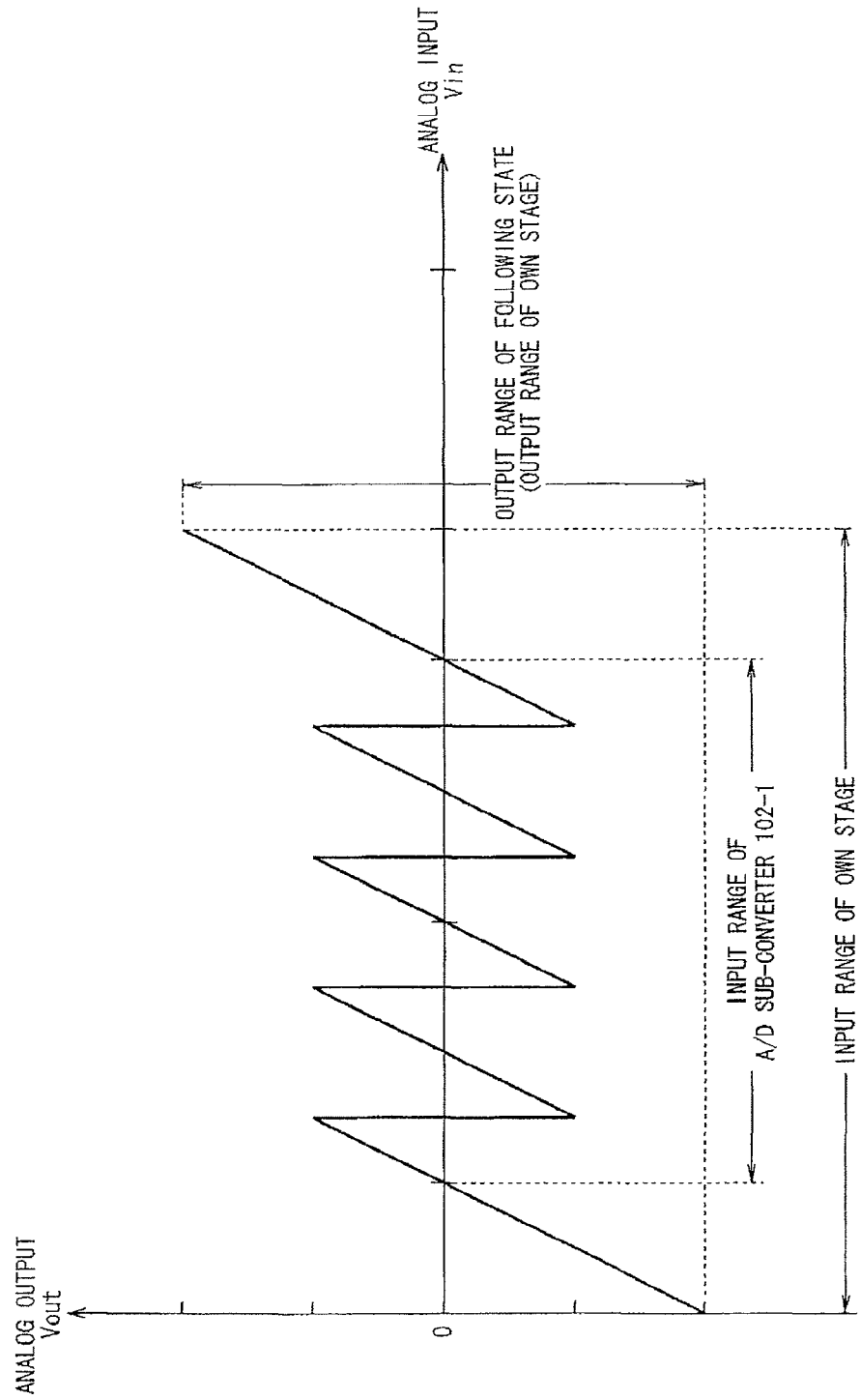
FIG. 14 is a graph illustrating a relationship between input range of the analog signal Vin and an output range of the analog signal Vout of the A/D converter 102-1b.

A relationship between the input range of the analog signal Vin and the output range of the analog signal Vout of the A/D converter 12-1 is the same as that shown in FIG. 14.

As shown by arrows in FIG. 14, the input range of the A/D converter 12-1 is expanded by 1.5 times. However, the output range of the A/D converter 12-1 falls within the input range of the A/D converter 12-2. This means that the input range of the pipeline type A/D converter is expanded by the amount corresponding to bits processed by the pipeline type A/D converter 12-1. The first A/D converter 12-1 is responsible for the most significant bit out of the S-digit digital output signals Dout. On this account, when the input range of the first A/D converter 12-1 is expanded by 1.5 times, the input range of the whole pipeline type A/D 10 is expanded by 1.5 times, thus increasing the digital output signal Dout to S+0.5 bits.

(Configuration of A/D Converters 12-2 to 12-k)

Figure 3:
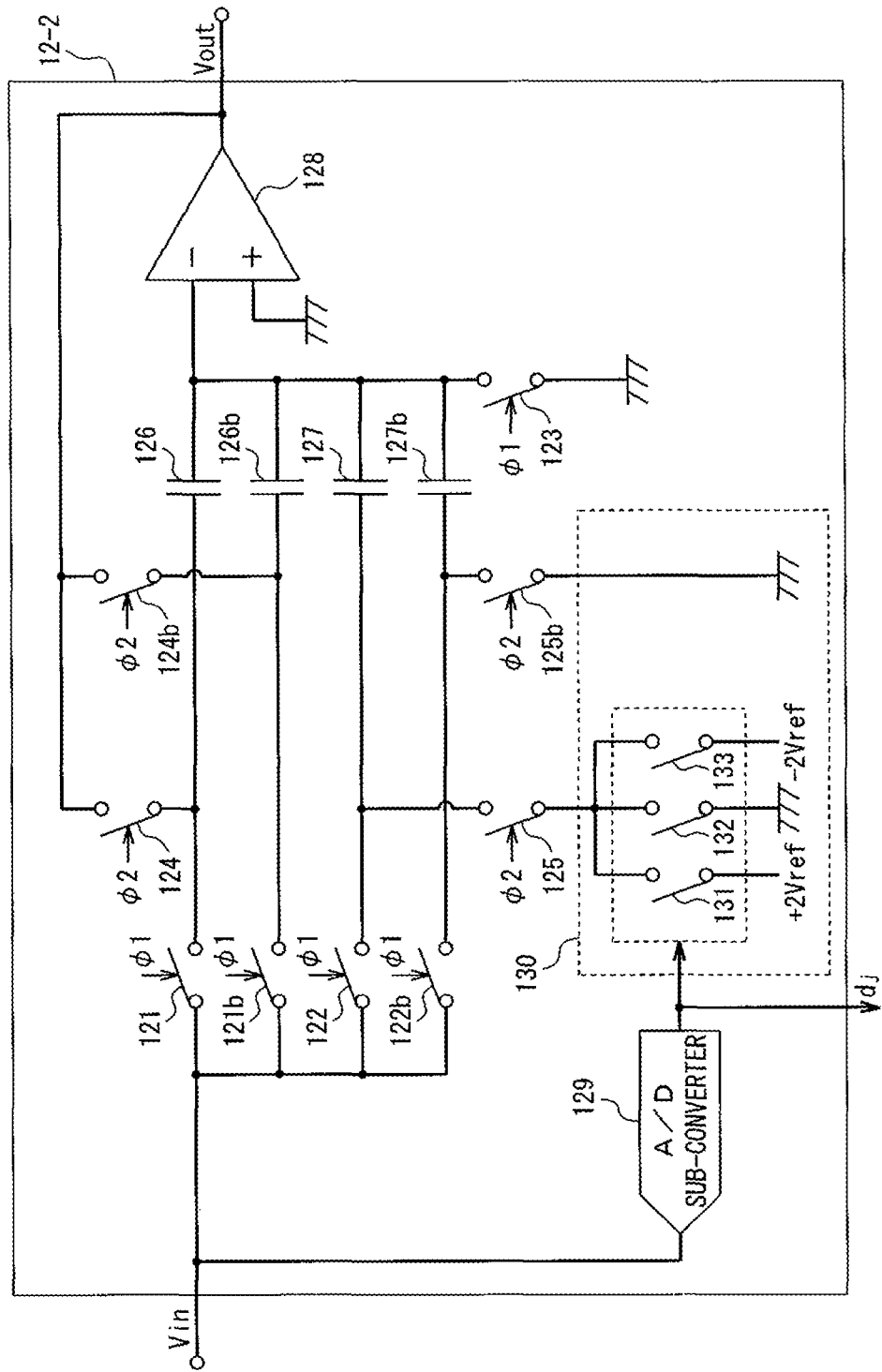
FIG. 3 is a block diagram showing a configuration of the pipeline type A/D converter 12-2 when resolution is 1.5 bits and the number of division of capacitors is 2.

Subsequently, referring now to FIG. 3, a description will be made to the configuration of the A/D converters 12-2 to 12-k included in the pipeline type A/D converter 10. Since the A/D converters 12-2 to 12-k are configured with the same elements, only the circuit configuration of the A/D converter 12-2 will be described. FIG. 3 is a block diagram showing the configuration of the A/D converter 12-2.

Although the A/D converter shown in FIG. 3 is configured with the same elements as those of the A/D converter 12-1, as shown in FIG. 2, they are different in that the multiple-value output circuit 130 does not include multiple-value output switching elements 131b to 133b and the sample-hold switching elements 125b outputs 0V in a fixed manner.

The A/D sub-converter 129 includes two comparators (not shown) and is designed to output one of three values of −1, 0, and 1 depending on the analog signal Vin. Thus, the multiple-value output circuit 130 is capable of outputting two reference voltages each including one of −2×Vref(V), 0V, and +2×Vref (V), and the reference voltage of 0V based on the output result of the A/D sub-converter 121.

Even in the A/D converter 12-2, the number of the sample-hold capacitors used for sampling the analog signal Vin of the A/D converter 12-1 is twice that of the A/D converter 102-1 shown in FIG. 11. However, as described above, the capacitance of the sample-hold capacitor of the A/D converter 12-1 is half that of the A/D converter 102-1 shown in FIG. 11. The total capacitance of the four sample-hold capacitors 126, 126b, 127, and 127b of the A/D converter 12-1 remain unchanged from those of the two sample-hold capacitors 126 and 127 of the A/D converter 102-1 shown in FIG. 11.

The operation of the A/D converter 12-2 is also the same as that of the A/D converter 12-1, and the sampling operation and the holding operation are alternately performed.

At the sampling operation, the sample-hold switching elements 121, 121b, 122, 122b, and 123 are switched to the connected state and the sample-hold switching elements 124, 124b, 125, and 125b are switched to the disconnected state. Then, the electrical charge corresponding to the analog signal Ain is sampled by using all the four sample-hold capacitors 126, 126b, 127, and 127b. At the same time, the A/D sub-converter 129 outputs one of values −1, 0, and 1 according to the analog signal Vin.

At the holding operation, the sample-hold switching elements 121, 121b, 122, 122b, and 123 are switched to the disconnected state and the sample-hold switching elements 124, 124b, 125, and 125b are switched to the connected state. Then, by utilizing the two sample-hold capacitors 126 and 126b each as a feedback element connected between the output terminal and the inverting input terminal of the operational amplifier 128, the analog signal vin is doubly amplified. Moreover, two doubled reference voltages each including one of −2×Vref(V), 0V, and +2×Vref (V) according to the output result of the A/D sub-converter 129, and the reference voltage of 0V are respectively output to the sample-hold capacitor 127. Thereby, the two reference voltages are added to and subtracted from the doubly amplified analog input signal and the analog signal Vout falls within the input range of the A/D converter 12-3 of the following stage.

As described above, the A/D converter 12-2 is designed to have the circuit configuration permitting utilizing voltage source of ±2×Vref, except for that, it has the same circuit configuration as the A/D converter 102-1 shown in FIG. 11 of which input range is not expanded. Accordingly, transfer characteristics of circuits, the amount of thermal noises, and an open loop gan required for the operational amplifier 128 of the A/D converter 102-2 are identical to the A/D converter 101-1 shown in FIG. 11.

(First Modification)

The A/D converters 12-1 to 12-k of the pipeline type A/D converter 10 according to the present embodiment are responsible for resolution of 1.5 bits (in this case, input signal is doubly amplified). When the number of division of the capacitors is 2 (i.e., N=2), a capacitor to be divided is not necessarily limited to the sample-hold capacitor.

Figure 4:
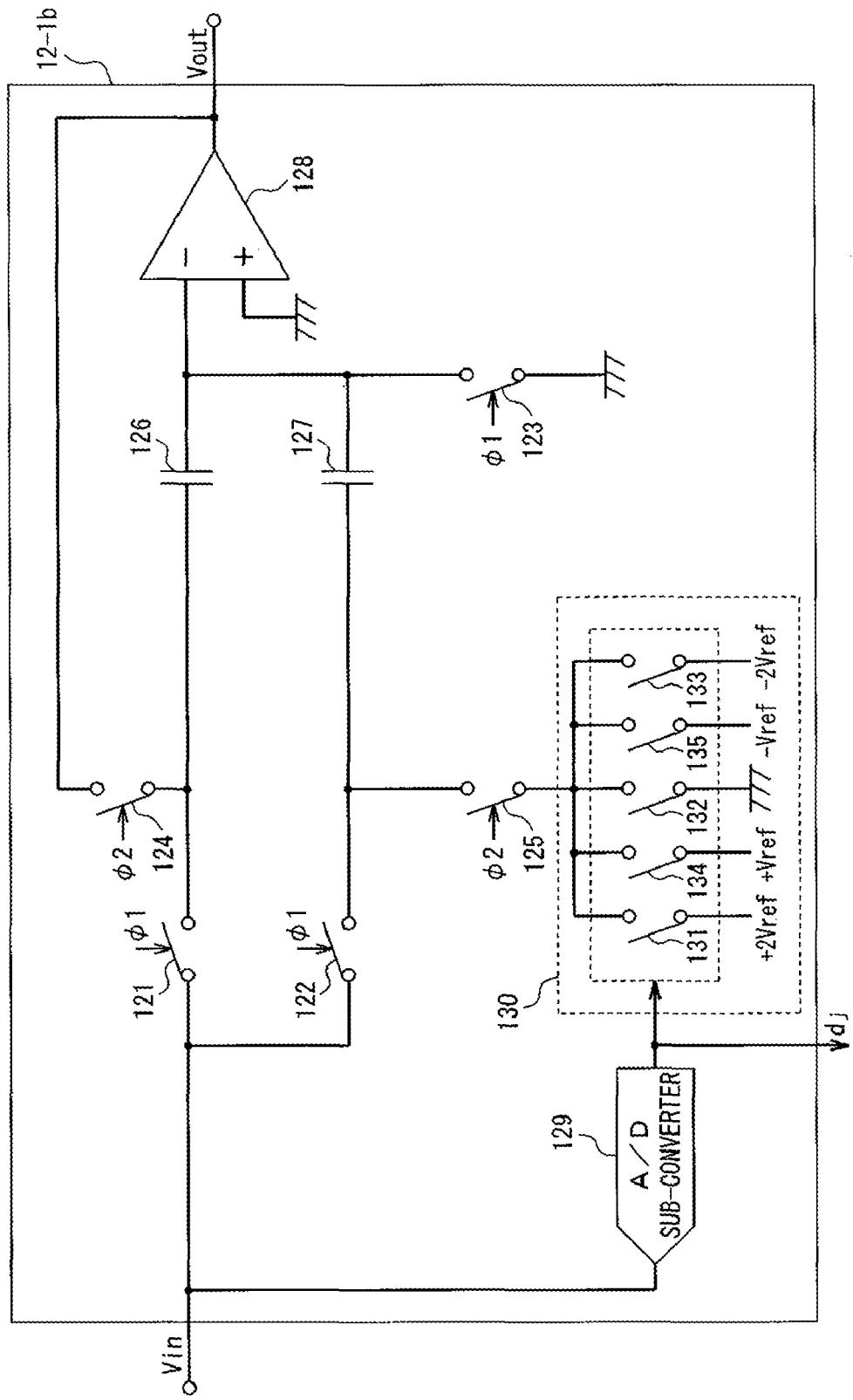
FIG. 4 is a block diagram showing a circuit configuration of the A/D converter 12-1b when resolution is 1.5 bits and the number of division of capacitors is 1.

FIG. 4 is a circuit diagram showing a circuit configuration of the A/D converter 22-1 when its resolution is 1.5 bits (in this case, input signal is doubly amplified) and the number of division of the capacitors is 1 (i.e., N=1).

While the A/D converter 12-1b shown in FIG. 4 is a circuit configured with the same elements as those of the A/D converter 12-1 shown in FIG. 2, they are different in that the multiple-value output circuit 130 outputs one of voltages from −2×Vref (V), 0V, and +2×Vref (V). In other words, when the number of division is 1 (N=1), the multiple-value output circuit 130 multiples one of voltages from −Vref (V), 0V, and +Vref (V) by L, where L is a positive integer equal to or greater than 1, to output the voltage as a reference voltage.

The A/D sub-converter 129 includes four comparators (not shown) and is designed to output one of four values −1, 0, 1, and 2 depending on the analog signal Vin. However, the capacitance of the sample-hold capacitor of the A/D converter 12-1b is the same as that of the sample-hold capacitor of the A/D converter 102-1 shown in FIG. 11. The total capacitance of the sample-hold capacitors 126 and 127 of the A/D converter 22-1 is the same as those of the two sample-hold A/D capacitors 126 and 127 of the A/D converter 102-1.

All the two sample-hold capacitors 126 and 127 are used for sampling of the analog input signal Vin. One sample-hold capacitor 126 out of the two sample-hold capacitors 126 and 127 is used as a feedback element. One of −2×Vref(V), −1×Vref(V), 0V, +1×Vref (V), +2×Vref (V) is output from the multiple-value output circuit 130 to the remaining one sample-hold capacitor 127.

After that, the sampling and holding operations are repeated in the same way as the A/D converter 12-1 shown in FIG. 2, by the A/D converter 12-1b. Then, the double reference voltage is added to or subtracted from the doubly amplified analog input signal, so the analog signal Vout falls within the input range of the A/D converter of the following stage.

A relationship between the input range of the analog signal Vin and the output range of the analog signal Vout of the A/D converter 12-1b is the same that shown in FIG. 14.

As shown by arrows in FIG. 14, the input range of the A/D converter 12-1b is expanded by 1.5 times. However, the output range of the A/D converter 12-1b falls within the input range of the A/D converter 12-2. This means that the input range of the pipeline type A/D converter 10 is expanded by the amount corresponding to bits processed by the A/D converter 12-1b. The first A/D converter 12-1b is responsible for the most significant bit out of the S-digit digital output signal Dout. For this reason, when the input range of the first A/D converter 12-1b is expanded by 1.5 times, the input range of the whole pipeline type A/D converter 10 is increased by 1.5 times, thus increasing the digital output signal Dout by S+0.5 bits.

As described above, the sampling operation of the analog signal Vin is carried out by using all the sample-hold capacitors without increasing the number of the sample-hold capacitors. The half of the sample-hold capacitors out of all the sample-hold capacitors are used as feedback elements to amplify the analog signal Vin, and the remaining sample-hold capacitors are used to add to and subtract from the reference voltage. Consequently, all the capacitors are involved in sampling of the analog signal Vin without exception. Further, since the ratio of capacitance of the remaining capacitors to that of the capacitors employed as feedback elements of the operational amplifier 128 is unchanged, the amount of feedback does not decrease. Therefore, this expands the input range of the pipeline type A/D converter 10 and increases the number of bits of the digital output signal, without increasing the open loop gain needed for the operational amplifier 128.

(Second Modification)

While the pipeline type A/D converters 12-1 to 12-k according to the present embodiment has the configuration in which the resolution is 1.5 bits (in this case, the input signal is doubly amplified) and the number of division of comparators is 2 (i.e., N=2), the number of division of the comparators is not necessarily limited to 2.

Figure 5:
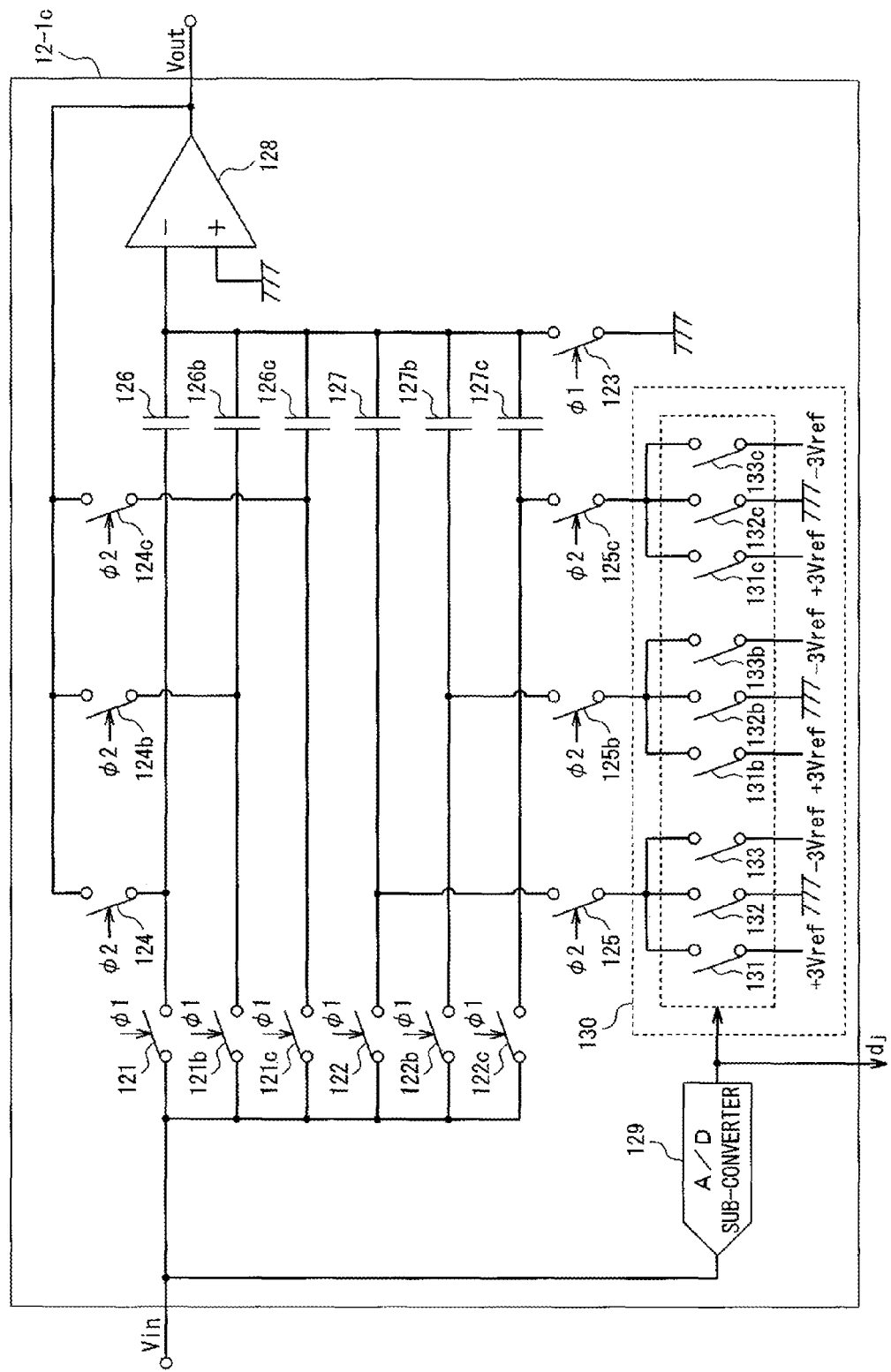
FIG. 5 is a circuit diagram showing a circuit configuration of the A/D converter 12-1c when resolution is 1.5 bits and the number of division of capacitors is 3.

FIG. 5 is a circuit diagram showing a circuit configuration in which the resolution is 1.5 bits (in this case, input signal is doubly amplified) and the number of division of the comparator is 2 (i.e., N=3).

Although the A/D converter 12-1c shown in FIG. 5 is a circuit configured with the same elements as those of the A/D converter 12-1 shown in FIG. 2, they are different in that the A/D converter 1201c further includes the sample-hold switching elements 121c, 122c, 124c, and 125c, the A/D converter 12-1c includes sample-hold capacitors 126c and 127c, and the multiple-value output circuit 130 includes three switching elements 131c, 132c, and 133c. Namely, letting N=3 and M=2, the A-D converter 12-1c doubly amplifies the input range by using N×M=3×2=6, that is six capacitors.

The A/D sub-converter 129 includes six comparators (not shown) and is designed to output one of seven values −3, −2, −1, 0, 1, 2, and 3 depending to the analog signal Vin. However, the capacitance of the sample-hold capacitor of the A/D converter 12-1c is 1/N=⅓ of that of the sample-hold capacitor of the A/D converter 102-2 shown in FIG. 11. The total capacitance of the six sample-hold capacitors 126, 126b, 126c, 127, 127b, 127c of the A/D converter 12-1c remain unchanged from that of the two sample-hold capacitors 126 and 127 of the A/D converters 102-2 show in FIG. 11.

All the six sample-hold capacitors 126, 127, 126b, 127b, 126c, and 127c are used for sampling of the analog input signal Vin. Further, three sample-hold capacitors 126, 126b, and 126c out of the six sample-hold capacitors 126, 126b, 126c, 127, 127b, and 127c are each used as a feedback element. Three reference voltages each including one of −3×Vref(V), 0V, and +3×Vref(V) is output from the multiple-value output circuit 130 to the remaining three sample-hold capacitors 127, 127b, and 127c.

The sampling and holding operations are repeated, as with the A/D converter 12-1 shown in FIG. 2, by the A/D converter 12-1c. Then, three treble reference voltages are added to and subtracted from the doubly amplified analog input signal and the analog signal Vout falls within the input range of the A/D converter of the following stage.

Figure 6:
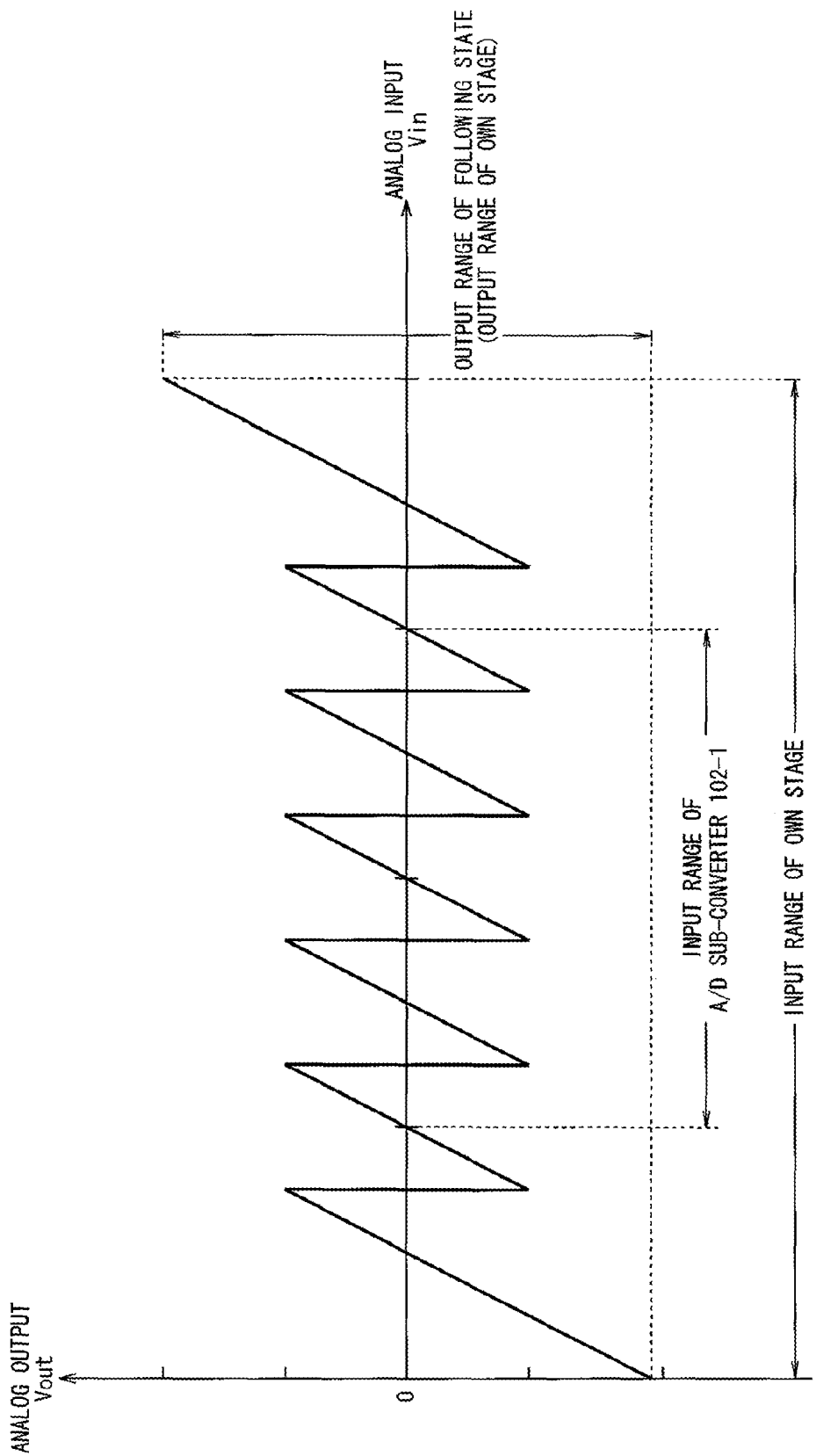
FIG. 6 is a graph illustrating a relationship between an input range of an analog signal Vin of the A/D converter 12-1c and an output range of the analog signal Vout.

Subsequently, a relationship between the input range of the analog signal Vin and the output range of the analog signal Vout of the A/D converter 12-1c will be described, by referring to FIG. 6. FIG. 6 is a graph illustrating the relationship between the input range of the analog signal Vin and the output range of the analog signal Vout of the A/D converter 12-1c.

The horizontal axis shown in FIG. 6 indicates voltage of the analog signal Vin input into the A/D converter 12-1c and the vertical axis thereof indicates voltage of the analog signal Vout output from the A/D converter 12-1c.

As shown by arrows in FIG. 6, the input range of the A/D converter 12-1c is doubled from that of the A/D converter 102-1 shown in FIG. 11. However, the input range falls within the output range of the A/D converter 12-1c, i.e., within the input range of the A/D converter 12-2. This means that the input range of the pipeline type A/D converter 12-1c is expanded by the amount corresponding to bits undertaken by the A/D converter 12-1c. The first A/D converter 12-1c is responsible for the most significant bit out of the S-digit digital output signal Dout. On this account, when the input range of the first A/D converter 12-1c is expanded by 2 times, the input of the whole pipeline type A/D converter 10 is expanded by 2 times I proportion thereto, thereby increasing the digital output signal Dout by S+1 bits.

As described above, even when the number of the sample-hold capacitors is increased, all the sample-hold capacitors are involved in sampling of the analog signal Vin. Furthermore, three sample-hold capacitors out of half thereof are each used as a feedback element to amplify the analog signal Vin and the remaining three sample-hold capacitors are used to add to and subtract from the reference voltage. Accordingly, even when the number of the sample-hold capacitors is increased, all of which are involved in sampling of the analog signal Vin without exception. Additionally, even when the number of the sample-hold capacitors is increased, the amount of feedback does not decrease, as the ratio of the capacitance of the remaining capacitors to those of the capacitors each used as a feedback element of the operational amplifier 128. Hence, this expands the input range of the pipeline type A/D converter 10 and increases the number of bits of the digital output signal, without increasing an open loop gain needed for the operational amplifier 128.

(Third Modification)

Although the A/D converters 12-1 to 12-k of the pipeline type A/D converter 10 according to the present embodiment has the configuration in which the resolution is 1.5 bits (in this case, the input signal is doubly amplified), the resolution is not necessarily limited to 1.5 bits.

Figure 7:
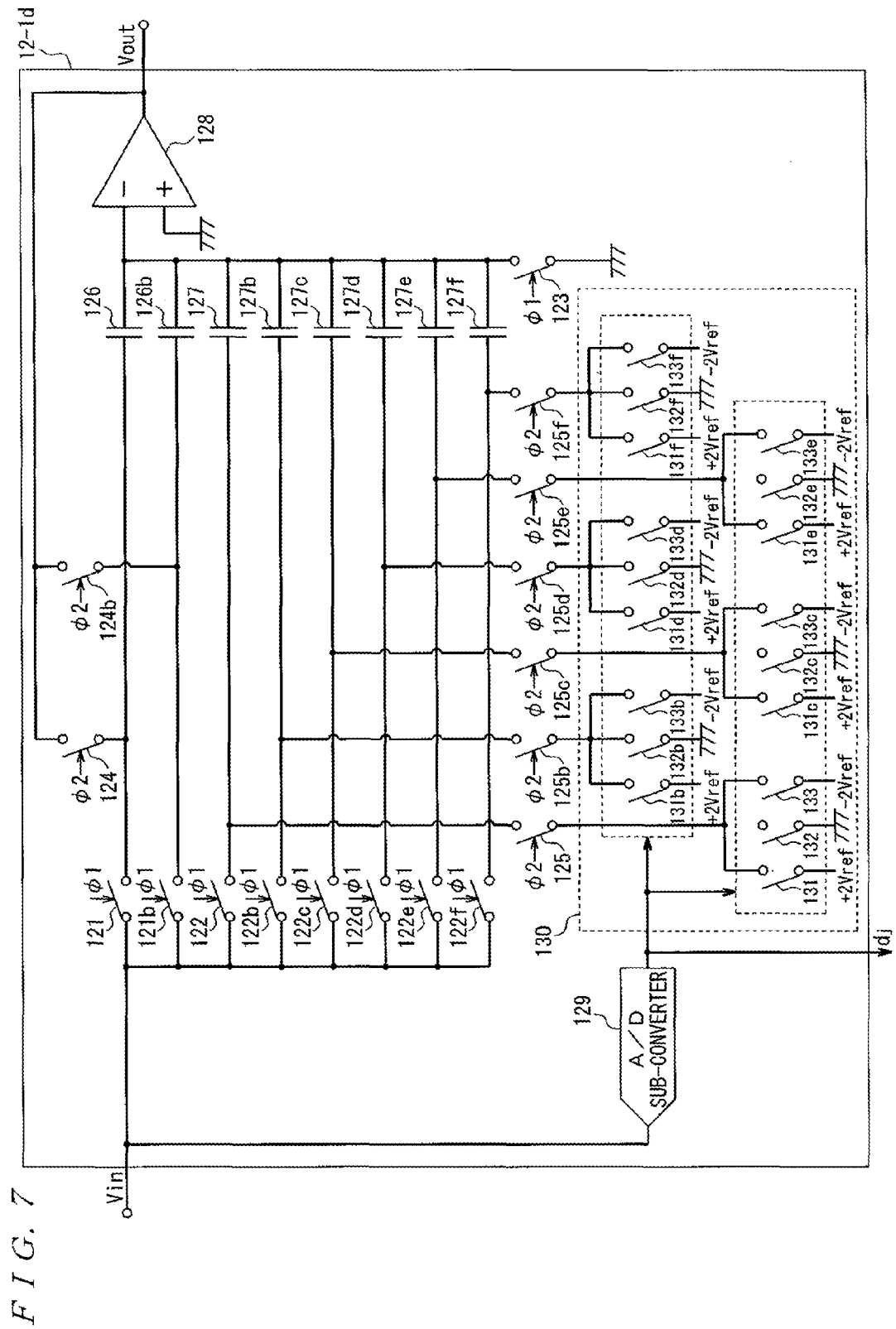
FIG. 7 is a circuit diagram showing a circuit configuration when an input range is expanded by 1.75 times in the A/D converter 12-1d of which resolution is 2.5 bits and the number of division of capacitors is 2.

FIG. 7 is a circuit diagram showing a circuit configuration in which the resolution is 2.5 bits (in this case, the input signal is fourfold amplified) and the number of the comparators is 2 (i.e., N=2).

Figure 12:
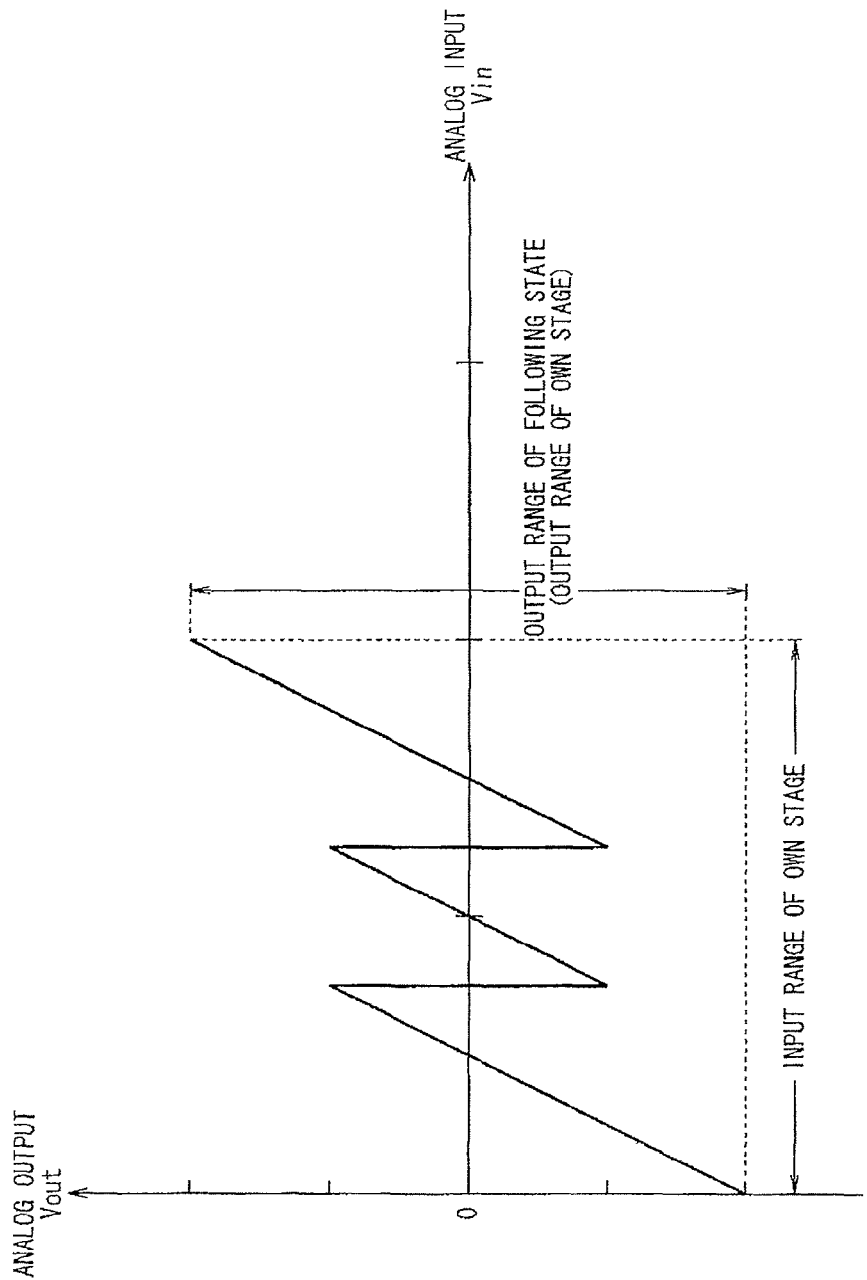
FIG. 12 is a graph illustrating a relationship between an input range of the analog signal Vin and an output range of the analog signal Vout of the A/D converter 102-1.
Figure 13:
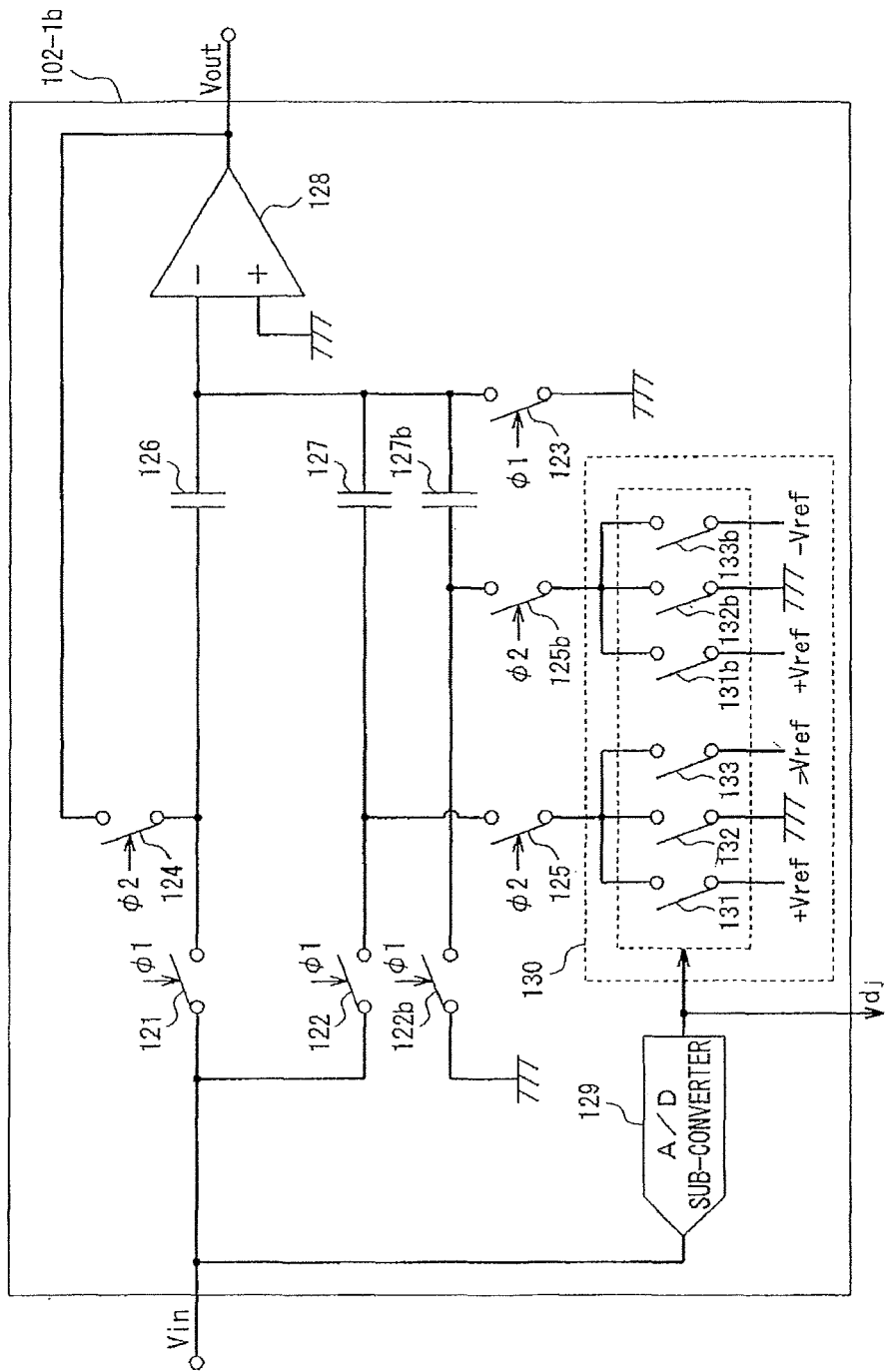
FIG. 13 is a circuit diagram showing a circuit configuration of the A/D converter 101-b of which resolution is 1.5 bits.

The A/D converter 12-1d shown in FIG. 7 is a circuit configured with the same circuit configuration as those of the A/D converter 12-1 shown FIG. 12, and they are different in that the A/D converter 12-1d further includes sample-hold switching elements 122c to 122f, and 125c to 125f, sample-hold capacitors 127c to 127f, and the multiple-value output circuit 130 includes eighteenth switching elements 131c to 131f, 132c to 132f, and 133c to 133f. In other words, the A/D converter 12-1d may increase the input range by four times by using N×M=2×4=8, namely eight capacitors.

The A/D sub-converter 129 includes six comparators (not shown) and is designed to output one of 13 values −6, −5, −4, −3, −2, −1, 0, 1, 2, 3, 4, 5, and 6 depending on the analog signal Vin. However, the capacitance of the sample-hold capacitors of the A/D converter 12-1d is 1/N=½ of that of the sample-hold capacitors of the A/D converter 102-1c. The total capacitance of eight sample-hold capacitors 126, 126b, 127, and 127b to 127f of the A/D converter 12-1d remain unchanged from that of four sample-hold capacitors 221 to 224 of the A/D converter 102-1c shown in FIG. 15.

All the eight sample-hold capacitors 126, 127, 126b, 127b, and 127c to 127f are used for sampling of the analog input signal Vin. Further, two sample-hold capacitors 126 and 126b out of the eight sample-hold capacitors 126, 126b, 127, and 127b to 127f are each used as a feedback element. Six reference voltages each including one of −2×ref(V), 0V, and +2×Vref(V) are output from the multiple-value output circuit 130 to the remaining six sample-hold capacitors 127, and 127b to 127f.

Then, the sampling operation and the holding operation are repeated by the A/D converter 12-1d, as with the A/D converter 12-1 shown in FIG. 2. Thereupon, four of the doubly amplified reference voltages are added to and subtracted from the fourfold amplified analog input signal, so the analog signal Vout falls within the input range of the A/D converter of the following stage.

Figure 8:
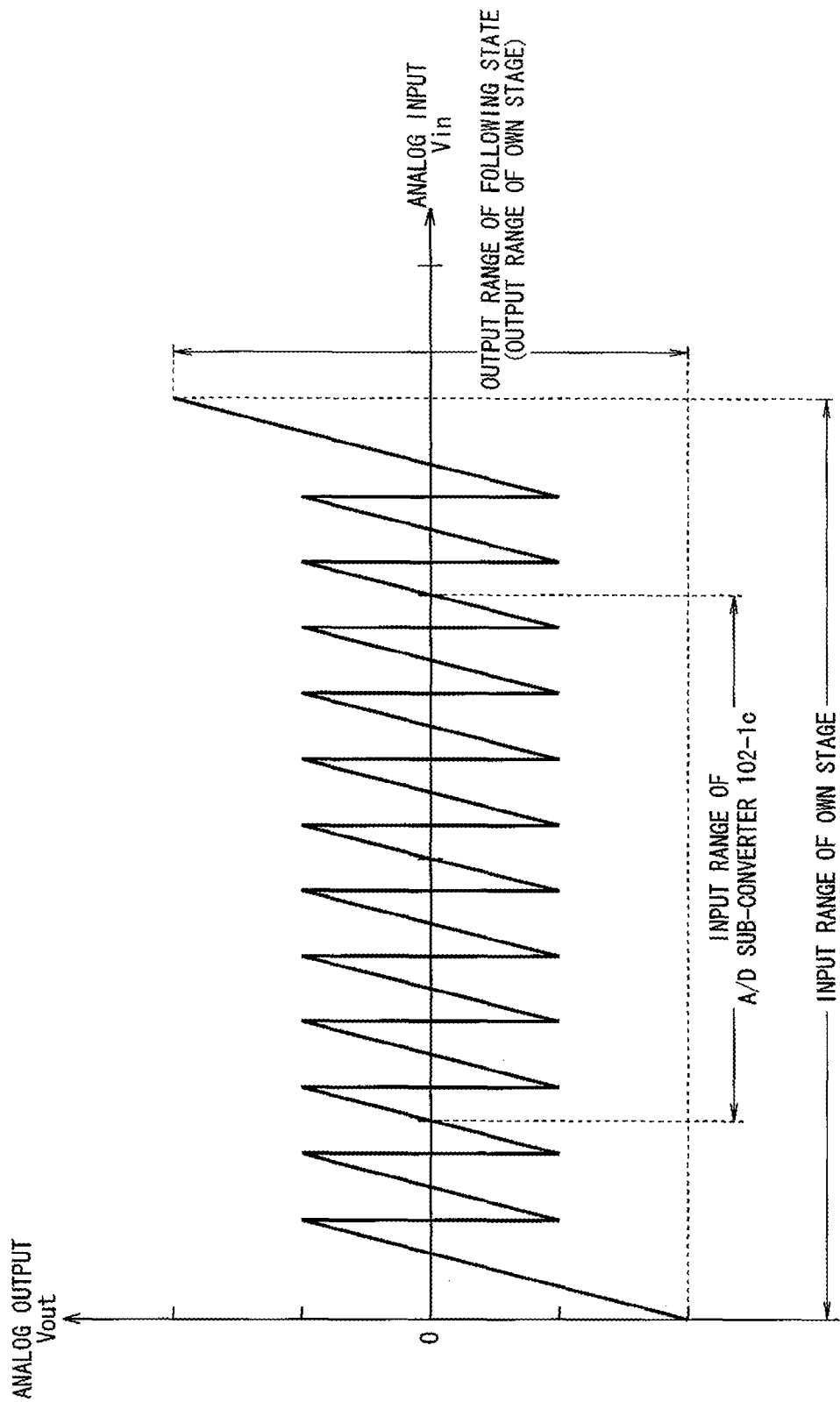
FIG. 8 is a graph illustrating a relationship between an input range of the A/D converter 12-1d and an output range of the analog signal Vout.

A description will next be made to a relationship between the input range of the analog signal Vin and the output range of the analog signal Vout of the A/D converter 12-1d, by referring to FIG. 8. FIG. 8 is a graph illustrating the relationship between the input range of the analog signal Vin and the output range of the analog signal Vout of the A/D converter 12-1d.

The horizontal axis shown in FIG. 8 indicates voltage of the analog signal Vin input into the A/D converter 12-1d and the vertical axis indicates voltage of the analog signal Vout output from the A/D converter 12-1d.

Figure 15:
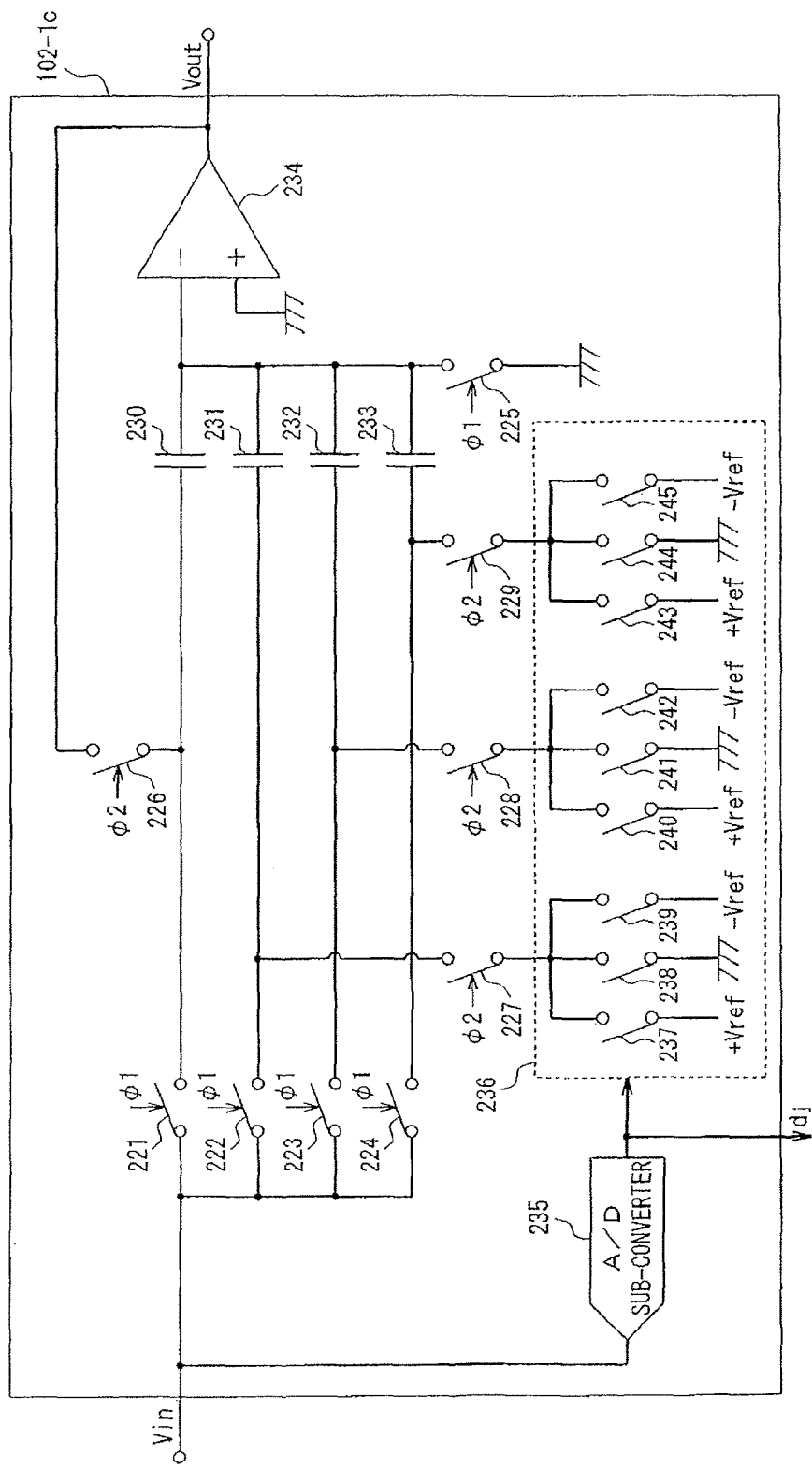
FIG. 15 is a circuit diagram shoeing a circuit configuration of the A/D converter 102-1c of which resolution is 2.5 bits.
Figure 16:
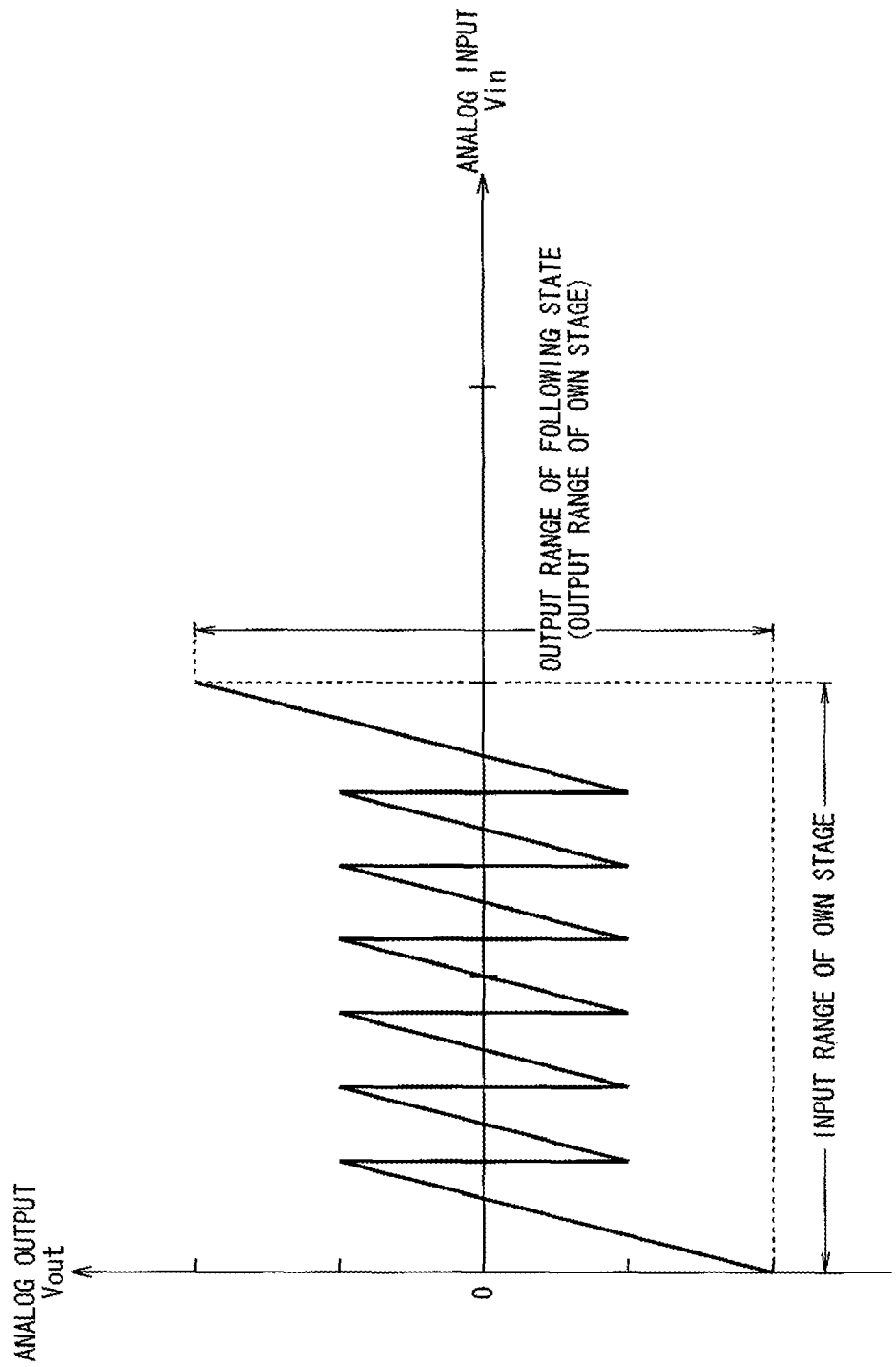
FIG. 16 is a graph illustrating a relationship between an input range and an output range of the analog signal Vout of the A/D converter 102-1c.
Figure 17:
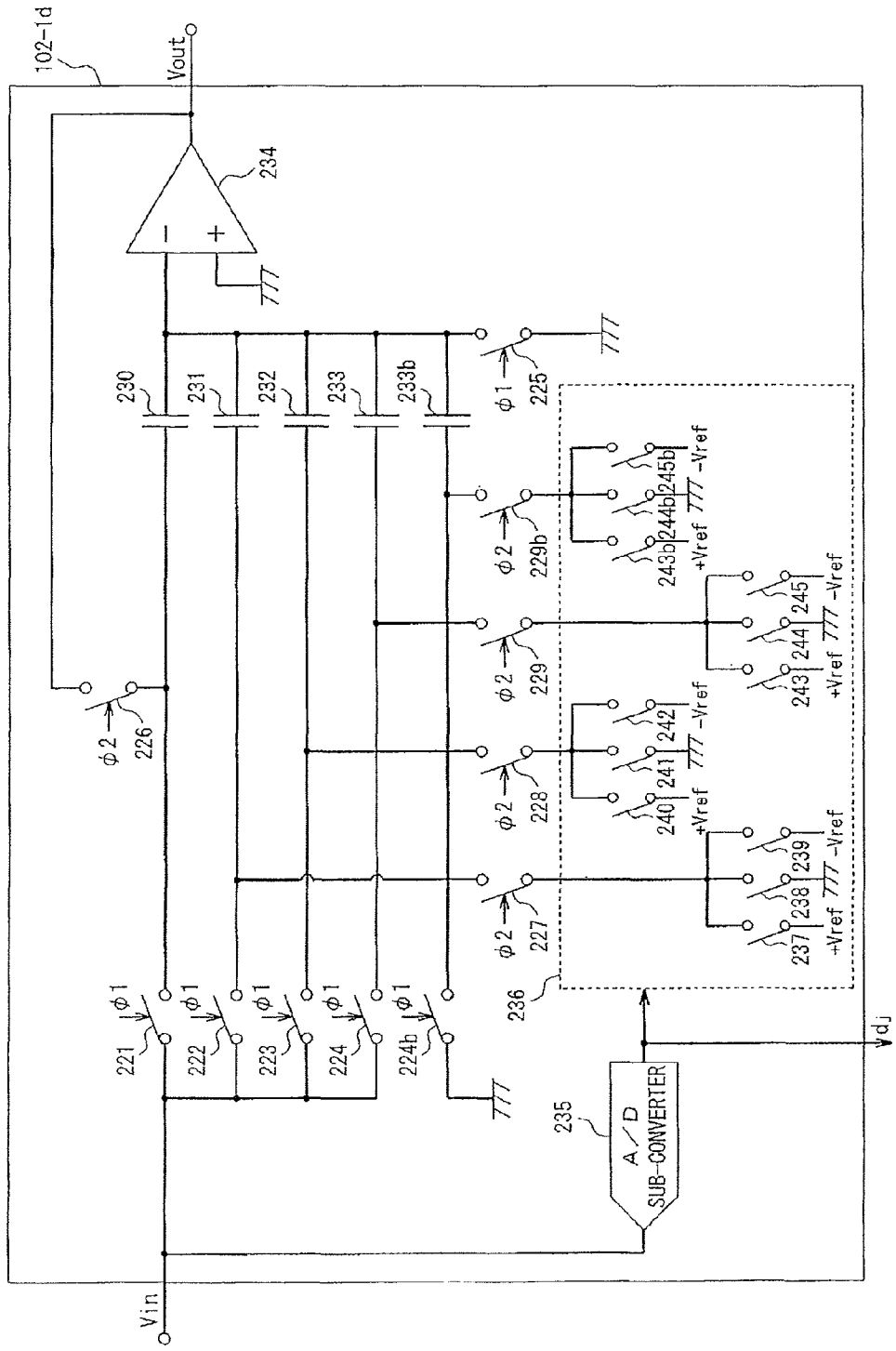
FIG. 17 is a block diagram showing a circuit configuration of the A/D converter 102-1d of which resolution is 2.5 bits.

As shown by arrows in FIG. 8, the input range of the A/D converter 12-1d is more expanded by 1.75 times from that of the A/D converter 102-1c shown in FIG. 15. However, the output range of the A/D converter 12-1d falls within the input range of the A/D converter 12-2. This means that the input range of the pipeline type A/D converter is expanded by the amount corresponding to bits processed by the A/D converter 12-1d. The first A/D converter 12-1d is responsible for the most significant bit out of the S-digit digital output signal Dout. For this reason, when the input range of the first A/D converter 12-1d is increased by 1.75 times, the input range of the whole pipeline type A/D converter 10 will be expanded by 1.75 times, thereby increasing the digital output signal Dout by S+0.75 bits.

Incidentally, if the input range of its own stage does not need such an expansion, the number of the switching elements of the multiple-value output circuit 130 can be reduced so the circuit size can be reduced.

Figure 9:
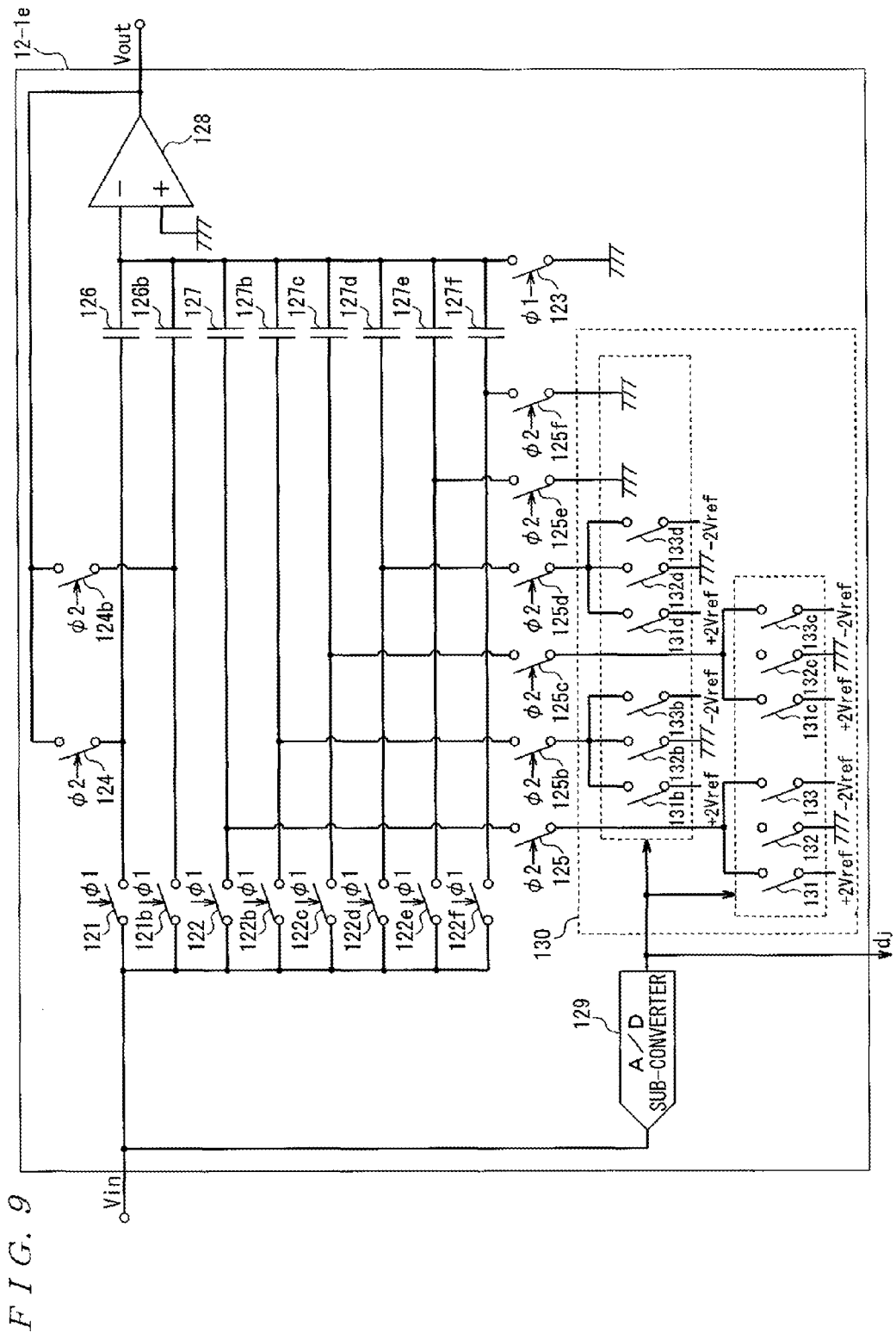
FIG. 9 is a circuit diagram showing a circuit configuration when an input range is expanded by 1.25 times and in the A/D converter 12-1e if which resolution is 2.5 bits and the number of division of capacitors is 2.
Figure 18:
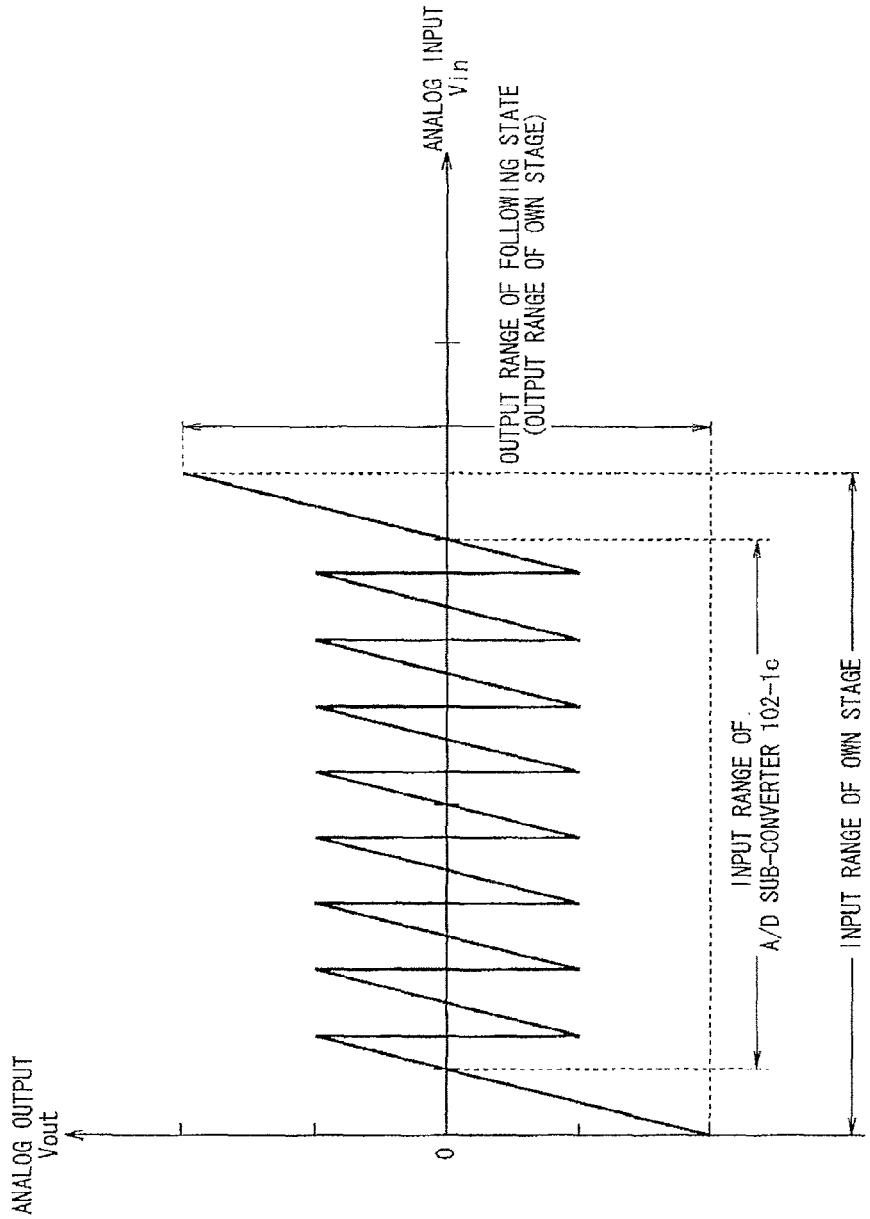
FIG. 18 is a graph illustrating a relationship between an input range and an output range of the analog signal Vout of the analog signal Vin of the A/D converter 102-1d.

FIG. 9 shows a circuit configuration of the A/D converter 102-1e in which the input range thereof is expanded by 1.25 times from that of the A/D converter 102-1c. In the A/D converter 102-1e shown in FIG. 9, six multiple-value output switching elements 131e, 132e, 133e, 131f, 132f, and 133f of the multiple-value output circuit 130 included in the A/D converter 12-1d shown in FIG. 7 are removed, and input terminals of the sample-hold switching capacitors 127e and 127f is grounded via the sample-hold switching elements 125e and 125f, respectively. In this case, a relationship between the input range of the analog signal Vin and the output range of the analog signal Vout of the A/D converter 21-1e is exactly the same as that shown in FIG. 18.

As described above, even when the number of the sample-hold capacitors is increased, all the sample-hold capacitors are involved in sampling of the analog signal Vin. Moreover, two sample-hold capacitors out of them are each used as a feedback element to amplify the analog signal Vin, and the remaining six sample-hold capacitors are used to add to and subtracted from the reference voltage. Thus, even when the number of the sample-hold capacitors is increased, all the capacitors are involved in sampling of the analog signal Vin. Furthermore, even when the number of the sample-hold capacitors is increased, the amount of feedback does not decrease, because the ratio of the capacitance of the remaining capacitors to that of the capacitors each used as a feedback element of the operational amplifier 128 is unchanged. This enables expanding the input range of the pipeline type A/D converter 10 and increasing the number of bits of the digital output signal Dout, without increasing the open loop gain needed for the operational amplifier 128.

CONCLUSION

In the pipeline type A/D converter 10 according to the present embodiment, regarding the number of the sample-hold capacitors included in the A/D converter 12-1, the number of the capacitors that can be used for addition and subtraction of the reference voltage is increased by dividing M capacitors (M is amplification degree of analog signal) necessary for the conventional technique into N, and by amplifying the reference voltage by N times. As a result, this allows expanding the input range and increasing the number of bits of the digital output signal. In that event, since all the capacitors are involved in sampling of the analog signal Vin, the thermal noises does not increase resulted from the expansion of the input range. What is better, since the ratio of the capacitors each used as a feedback element to amplify the analog signal Vin and the remaining capacitors is unchanged, before and after the division of the capacitors. Therefore, the open loop gain needed for the operational amplifier will not be increased by expanding the input range.

The present invention is not limited to dividing the sample-hold capacitors. The same characteristics may be available by dividing (by having more) reference voltages.

INDUSTRIAL APPLICABILITY

Especially, the present invention is applicable to pipeline type A/D converters for video cameras, audio devices, and the like which necessitate conversion processing from analog signals into digital signals.

REFERENCE SIGNS LIST 10 pipeline type A/D converter
101 sample-hold circuit
102-1 to 102-k A/D converter
103 memory
104 arithmetic circuit
105 controller
121 to 125, 121b, 122b, 124, 125b sample-hold switching element
126, 127, 126b, 127b sample-hold capacitor
128 operational amplifier
129 A/D sub-converter
131 to 133, 131b to 133b multiple-value output switching element

The invention claimed is:

1. A pipeline type A/D converter, comprising:
a sample-hold section for sampling and holding an analog signal;
a plurality of A/D converting sections for converting the analog signal held by the sample-hold section into a plurality of digital signals;
an arithmetic section for synthesizing the plural digital signals output from the plurality of A/D converting sections; and
a control section for controlling operations executed by the plurality of A/D converting sections,
wherein each of the plurality of A/D converting sections includes an A/D sub-converting section for converting an analog signal into a digital signal, a reference voltage generating section for generating a reference voltage corresponding to a converted result by said each of the plurality of A/D sub-converting sections, and a signal amplifying section for amplifying a differential signal between the reference voltage and the analog signal,
wherein the signal amplifying section includes: N×M charge and discharge elements each having a capacitance C/N, where C denotes a prescribed capacitance of a positive integer, N denotes a prescribed division number of an integer equal to or greater than 2, and M denotes an amplification degree of the analog signal of an integer equal to or greater than 2; a switching element; and an operational amplifier,
wherein the reference voltage generating section outputs the reference voltage obtained by multiplying a prescribed voltage by N,
wherein at a sampling operation, the control section controls for sampling the analog signal by use of all of the N×M charge and discharge elements, and
wherein at a holding operation, the control section controls for amplifying the analog signal to M times thereof by use of N charge and discharge elements out of all of the N×M charge and discharge elements, and for adding and subtracting the reference voltage obtained by multiplying the prescribed voltage by N to and from the analog signal amplified by use of remaining N×(M−1) charge and discharge elements.

2. The pipeline type A/D converter according to claim 1, wherein each of the charge and discharge elements is connected between an input terminal of the analog signal and an inverting input terminal of the operational amplifier,
wherein the switching element includes a first switching element connected between the input terminal of the analog signal and an input terminal of a charge and discharge element, a second switching element connected between the output terminal of the operational amplifier and the input terminal of the charge and discharge element, and a third switching element connected between the output terminal of the reference voltage generating section and the input terminal of the charge and discharge generating section,
wherein the control section controls a switching operation of an electrical connection state the first to third switching elements such that, at the sampling operation, all of the N×M charge and discharge elements each are connected between the input terminal and the inverting input terminal of the operational amplifier through the first switching element, and, at the holding operation, the N charge and discharge elements out of all of the N×M charge and discharge elements each are connected between the output terminal and the inverting input terminal of the operational amplifier through the second switching element, the remaining N×(M−1) charge and discharge elements each are connected between the output terminal of the reference voltage generating section and the inverting input terminal of the operational amplifier through the third switching element.

3. The pipeline type −A/D converter according to claim 2, wherein the reference voltage generating section generates the reference voltage obtained by multiplying the prescribed voltage by N, where the prescribed voltage is any one of −Vref(V), 0V, and +Vref(V).

4. The pipeline type −A/D converter according to claim 1, wherein the reference voltage generating section generates the reference voltage obtained by multiplying the prescribed voltage by N, where the prescribed voltage is any one of −Vref(V), 0V, and +Vref(V).

* * * * *